(12) United States Patent
Baek et al.

(10) Patent No.: US 11,711,941 B2
(45) Date of Patent: Jul. 25, 2023

(54) ORGANIC LIGHT EMITTING DISPLAY PANEL AND ORGANIC LIGHT EMITTING DISPLAY DEVICE INCLUDING THE SAME

(71) Applicant: LG Display Co., Ltd., Seoul (KR)

(72) Inventors: JungSun Baek, Gyeonggi-do (KR); Taehwan Kim, Gyeonggi-do (KR); Sunmi Lee, Gyeonggi-do (KR); Hyeonchul Im, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 203 days.

(21) Appl. No.: 17/016,938

(22) Filed: Sep. 10, 2020

(65) Prior Publication Data

US 2021/0074955 A1    Mar. 11, 2021

(30) Foreign Application Priority Data

Sep. 11, 2019  (KR) .......................... 10-2019-0112610

(51) Int. Cl.
*H10K 50/856*    (2023.01)
*H10K 50/844*    (2023.01)
(Continued)

(52) U.S. Cl.
CPC ......... *H10K 50/856* (2023.02); *H10K 50/844* (2023.02); *H10K 59/122* (2023.02); *G09G 3/3258* (2013.01); *G09G 3/3266* (2013.01); *G09G 3/3275* (2013.01); *G09G 2310/08* (2013.01)

(58) Field of Classification Search
CPC ............ H01L 51/5271; H01L 51/5253–5256; H01L 27/3246; G09G 3/3258; G09G 3/3266; G09G 3/3275; G09G 2310/08; H10K 50/856; H10K 50/844; H10K 59/122
See application file for complete search history.

(56) References Cited

U.S. PATENT DOCUMENTS

| | | | |
|---|---|---|---|
| 2014/0070182 A1* | 3/2014 | Choi | H01L 51/5271 257/40 |
| 2015/0060820 A1* | 3/2015 | Takagi | H01L 51/5218 438/46 |

(Continued)

FOREIGN PATENT DOCUMENTS

KR    1020180078142 A  *  7/2018

*Primary Examiner* — Shaun M Campbell
(74) *Attorney, Agent, or Firm* — Birch, Stewart, Kolasch & Birch, LLP

(57) ABSTRACT

Embodiments of the disclosure relate to an organic light emitting display panel and an organic light emitting display device including the same, and more specifically, to an organic light emitting display panel and an organic light emitting display device which include: an insulation film with at least one concave portion including a flat portion and an inclined portion surrounding the flat portion in at least one subpixel, a first electrode disposed on the concave portion, an organic layer disposed on the first electrode, a second electrode disposed on the organic layer, an encapsulation layer disposed on the second electrode, and at least one structure disposed on the encapsulation layer, overlapping at least one light emitting area, and having at least a side surface where a light reflecting member is disposed, thereby enhancing light extraction efficiency.

20 Claims, 13 Drawing Sheets

(51) Int. Cl.
*H10K 59/122* (2023.01)
*G09G 3/3258* (2016.01)
*G09G 3/3275* (2016.01)
*G09G 3/3266* (2016.01)

(56) References Cited

U.S. PATENT DOCUMENTS

| | | | |
|---|---|---|---|
| 2017/0125740 A1* | 5/2017 | Lee | H01L 51/5271 |
| 2018/0151628 A1* | 5/2018 | Park | H01L 51/5265 |
| 2020/0013846 A1* | 1/2020 | Kwon | H01L 27/3276 |
| 2020/0194711 A1* | 6/2020 | Kim | H01L 27/3258 |
| 2020/0211929 A1* | 7/2020 | Son | G09G 5/08 |
| 2021/0175476 A1* | 6/2021 | Oh | G06F 3/0412 |
| 2021/0202585 A1* | 7/2021 | Chen | H01L 51/5218 |
| 2021/0233979 A1* | 7/2021 | Ma | H01L 51/5212 |

\* cited by examiner

ORGANIC LIGHT EMITTING
DISPLAY DEVICE INCLUDING THE SAME

CROSS-REFERENCE TO RELATED
APPLICATION

This application claims priority from Korean Patent Application No. 10-2019-0112610, filed on Sep. 11, 2019, which is hereby incorporated by reference for all purposes as if fully set forth herein.

FIELD

Various embodiments of the disclosure relate to an organic light emitting display panel and an organic light emitting display device including the same.

BACKGROUND

The growth of the intelligent society leads to increased demand for various types of display panels, as for display devices or lighting devices. Among display panels, organic light emitting display panels may be thin and lightweight with no need for a separate light source, thus gaining popularity.

The organic light emitting display panel includes an organic layer to emit light. Part of the light emitted from the organic layer may be trapped inside the organic light emitting display device. Thus, the light extraction efficiency of the organic light emitting display panel may be lowered, and so is the lighting efficiency.

SUMMARY OF THE INVENTION

Embodiments of the disclosure aim to provide an organic light emitting display panel and an organic light emitting display device, which have a structure with enhanced light extraction efficiency.

Embodiments of the disclosure also aim to provide an organic light emitting display panel and an organic light emitting display device, which have a structure capable of preventing color mixing between two adjacent subpixels.

Embodiments of the disclosure also aim to provide an organic light emitting display panel and an organic light emitting display device, which have a high brightness in a structure in which a plurality of panels are connected.

According to embodiments of the disclosure, there may be provided an organic light emitting display panel and an organic light emitting display device, including a plurality of subpixels, each of the plurality of subpixels including at least one light emitting area. The organic light emitting display panel comprises an insulation film disposed on a substrate and including at least one concave portion, the at least one concave portion including a flat portion and an inclined portion surrounding the flat portion in at least one subpixel area; a first electrode disposed on the concave portion and a portion of a surrounding portion disposed around the concave portion in the at least one subpixel area; a bank including a first portion disposed on the first electrode in an area corresponding to a portion of the concave portion and a second portion disposed on the insulation film and the first electrode in an area corresponding to the surrounding portion; an organic layer overlapping the concave portion and disposed on the first electrode, the organic layer including at least one light emitting layer; a second electrode disposed on the organic layer and the bank; an encapsulation layer disposed on the second electrode; and at least one structure disposed on the encapsulation layer, overlapping at least one light emitting area, and having at least one side surface where a light reflecting member is disposed.

According to embodiments of the disclosure, there may be provided an organic light emitting display panel and an organic light emitting display device, including a plurality of subpixels, each of the plurality of subpixels including at least one light emitting area. The organic light emitting display device comprises an insulation film disposed on a first substrate and including at least one concave portion, the at least one concave portion including a flat portion and an inclined portion surrounding the flat portion in at least one subpixel area; a first electrode disposed on the concave portion and a portion of a surrounding portion disposed around the concave portion in the at least one subpixel area; a bank including a first portion disposed on the first electrode in an area corresponding to a portion of the concave portion and a second portion disposed on the insulation film and the first electrode in an area corresponding to the surrounding portion; an organic layer overlapping the concave portion and disposed on the first electrode, the organic layer including at least one light emitting layer; a second electrode disposed on the organic layer and the bank; an encapsulation layer disposed on the second electrode; and at least one structure disposed on the encapsulation layer, overlapping at least one light emitting area, and having at least one side surface where a light reflecting member is disposed, wherein in an area where the flat portion is provided, an area in which the first electrode does not overlap the bank is a first emission area included in the light emitting area, wherein in the area where the flat portion is provided, an area in which the bank overlaps the first electrode is a first non-emission area, wherein an area corresponding to the inclined portion is a second emission area included in the light emitting area, and wherein an area corresponding to the surrounding portion is a second non-emission area.

According to embodiments of the disclosure, there may be provided an organic light emitting display panel and an organic light emitting display device, which have a structure with enhanced light extraction efficiency.

According to embodiments of the disclosure, there may be provided an organic light emitting display panel and an organic light emitting display device, which have a structure capable of preventing color mixing between two adjacent subpixels.

According to embodiments of the disclosure, there may be provided an organic light emitting display panel and an organic light emitting display device, which have a high brightness in a structure in which a plurality of panels are connected.

DESCRIPTION OF THE DRAWINGS

The above and other objects, features, and advantages of the disclosure will be more clearly understood from the following detailed description, taken in conjunction with the accompanying drawings, in which.

DETAILED DESCRIPTION

Figure 1:
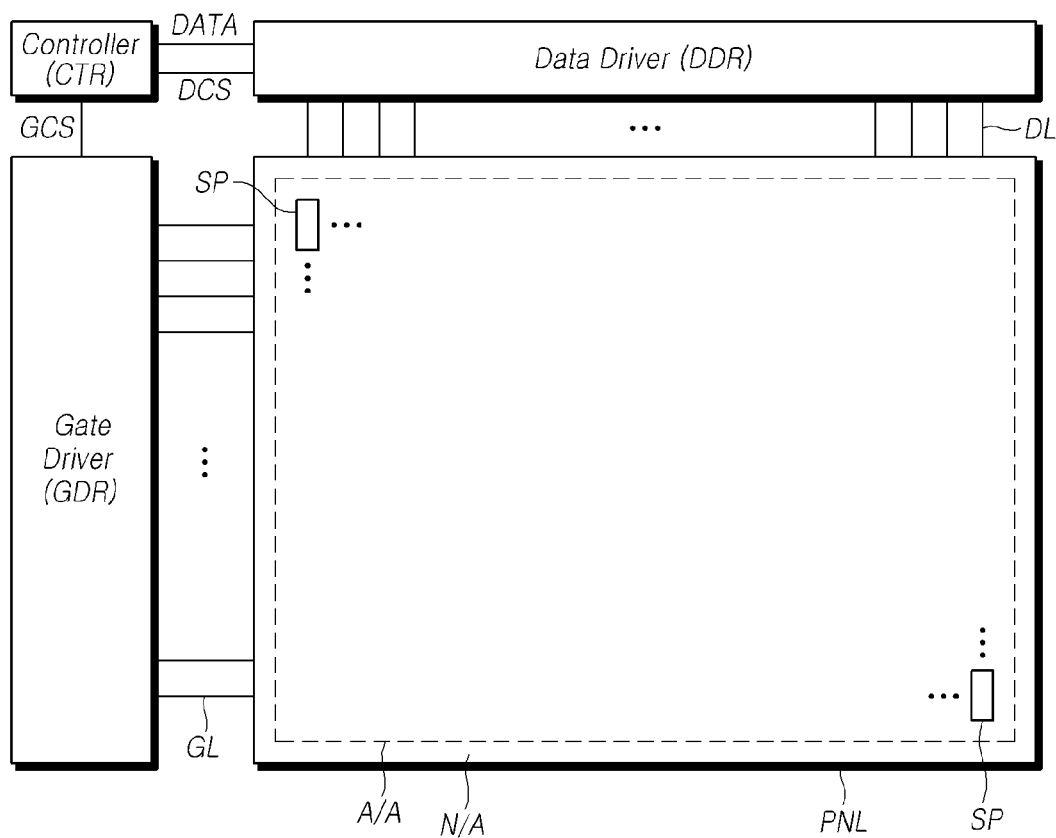
FIG. 1 is a view schematically illustrating a system configuration of an organic light emitting display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, embodiments of the disclosure are described in detail with reference to the accompanying drawings.

FIG. 1 is a view schematically illustrating a system configuration of an organic light emitting display device according to embodiments of the disclosure.

According to embodiments of the disclosure, a display device may include a panel PNL for displaying images or outputting light and a driving circuit for driving the panel PNL.

The panel PNL may include a plurality of data lines DL, a plurality of gate lines GL, and a plurality of subpixels SP defined by the plurality of data lines DL and the plurality of gate lines GL and arranged in a matrix type.

In the panel PNL, the plurality of data lines DL and the plurality of gate lines GL may be disposed to cross each other. For example, the plurality of gate lines GL may be arranged in rows or columns, and the plurality of data lines DL may be arranged in columns or rows. For ease of description, it is assumed below that the plurality of gate lines GL are arranged in rows, and the plurality of data lines DL are arranged in columns.

The panel PNL may have other kinds of signal wires, as well as the plurality of data lines DL and the plurality of gate lines GL, depending on, e.g., the subpixel structure. The panel PNL may further have driving voltage wires, reference voltage wires, or common voltage wires.

The kind of the signal wires disposed on the panel PNL may be varied depending on, e.g., the subpixel structure or panel type. In this disclosure, the concept of signal wire may encompass signal-applied electrodes.

The panel PNL may include an active area A/A for displaying pictures or images and a non-active area N/A, in which no image is displayed, around the active area A/A. The non-active area N/A is also referred to as a bezel area.

The active area A/A includes a plurality of subpixels SP for displaying images.

The non-active area N/A has a pad area for electrical connection with a data driver DDR and may have a plurality of data link lines to connect the pad area with the plurality of data lines DL. The plurality of data link lines may be extensions of the plurality of data lines DL to the non-active area N/A or may be separate patterns electrically connected with the plurality of data lines DL.

The non-active area N/A may also include gate driving-related wires to transfer voltage (signals) necessary for gate driving to a gate driver GDR through pads electrically connected with the data driver DDR. For example, the gate driving-related wires may include clock wires for transferring clock signals, gate voltage wires for transferring gate voltages VGH and VGL, and gate driving control signal wires for transferring various control signals necessary to generate scan signals. The gate driving-related wires are disposed in the non-active area N/A, unlike the gate lines GL disposed in the active area A/A.

The driving circuit may include the data driver DDR for driving the plurality of data lines DL, the gate driver GDR for driving the plurality of gate lines GL, and a controller CTR for controlling the data driver DDR and the gate driver GDR.

The data driver DDR may drive the plurality of data lines DL by outputting data voltage to the plurality of data lines DL.

The gate driver GDR may drive the plurality of gate lines GL by outputting scan signals to the plurality of gate lines GL.

The controller CTR may control the driving operation of the data driver DDR and gate driver GDR by supplying various control signals DCS and GCS necessary for the driving operation of the data driver DDR and gate driver GDR. Further, the controller CTR may supply image data DATA to the data driver DDR.

The controller CTR starts scanning according to a timing implemented in each frame, converts input image data input from the outside into image data DATA suited for the data signal format used in the data driver DDR, outputs the image data DATA, and controls data driving at an appropriate time suited for scanning.

To control the data driver DDR and gate driver GDR, the controller CTR receives timing signals, such as a vertical sync signal Vsync, horizontal sync signal Hsync, input data enable signal (Data Enable, DE), or clock signal CLK from the outside (e.g., a host system), generate various control signals, and outputs the control signals to the data driver DDR and gate driver GDR.

As an example, to control the gate driver GDR, the controller CTR outputs various gate control signals GCS including a gate start pulse GSP, a gate shift clock GSC, and a gate output enable signal (Gate Output Enable, GOE).

To control the data driver DDR, the controller CTR outputs various data control signals DCS including, e.g., a source start pulse SSP, a source sampling clock SSC, and a source output enable signal (Source Output Enable, SOE).

The controller CTR may be a timing controller used in typical display technology, or a control device that may perform other control functions as well as the functions of the timing controller.

The controller CTR may be implemented as a separate component from the data driver DDR, or the controller CTR, along with the data driver DDR, may be implemented as an integrated circuit.

The data driver DDR receives the image data DATA from the controller CTR and supply data voltage to the plurality of data lines DL, thereby driving the plurality of data lines DL. Here, the data driver DDR is also referred to as a source driver.

The data driver DDR may exchange various signals with the controller CTR via various interfaces.

The gate driver GDR sequentially drives the plurality of gate lines GL by sequentially supplying scan signals to the plurality of gate lines GL. Here, the gate driver GDR is also referred to as a scan driver.

The gate driver GDR sequentially supplies scan signals of On voltage or Off voltage to the plurality of gate lines GL under the control of the controller CTR.

When a specific gate line is opened by the gate driver GDR, the data driver DDR converts the image data DATA received from the controller CTR into an analog data voltage and supplies the analog data voltage to the plurality of data lines DL.

The data driver DDR may be positioned on only one side (e.g., the top or bottom side) of the panel PNL and, in some cases, the data driver DDR may be positioned on each of two opposite sides (e.g., both the top and bottom sides) of the panel PNL depending on, e.g., driving schemes or panel designs.

The gate driver GDR may be positioned on only one side (e.g., the left or right side) of the panel PNL and, in some cases, the gate driver GDR may be positioned on each of two opposite sides (e.g., both the left and right sides) of the panel PNL depending on, e.g., driving schemes or panel designs.

The data driver DDR may include one or more source driver integrated circuits (SDICs).

Each source driver integrated circuit (SDIC) may include a shift register, a latch circuit, a digital-to-analog converter (DAC), and an output buffer. In some cases, the data driver DDR may further include one or more analog-digital converters ADC.

Each source driver integrated circuit (SDIC) may be connected, in a tape automated bonding (TAB) type or chip-on-glass (COG) type, to the bonding pad of the panel PNL or may be disposed directly on the panel PNL. In some cases, each source driver integrated circuit (SDIC) may be integrated and disposed on the panel PNL. Each source driver integrated circuit (SDIC) may be implemented in a chip-on-film (COF) type. In this case, each source driver integrated circuit (SDIC) may be mounted on a circuit film and be electrically connected with the data lines DL of the panel PNL through the circuit film.

The gate driver GDR may include a plurality of gate driving circuits GDC. The plurality of gate driving circuits may respectively correspond to the plurality of gate lines GL.

Each gate driving circuit GDC may include, e.g., a shift register and a level shifter.

Each gate driving circuit GDC may be connected, in a tape automated bonding (TAB) type or chip-on-glass (COG) type, to the bonding pad of the panel PNL. Each gate driving circuit GDC may be implemented in a chip-on-film (COF) scheme. In this case, each gate driving circuit GDC may be mounted on a circuit film and be electrically connected with the gate lines GL of the panel PNL through the circuit film. Each gate driving circuit GDC may be implemented in a gate-in-panel (GIP) type and be embedded in the panel PNL. In other words, each gate driving circuit GDC may be formed directly on the panel PNL.

Figure 2:
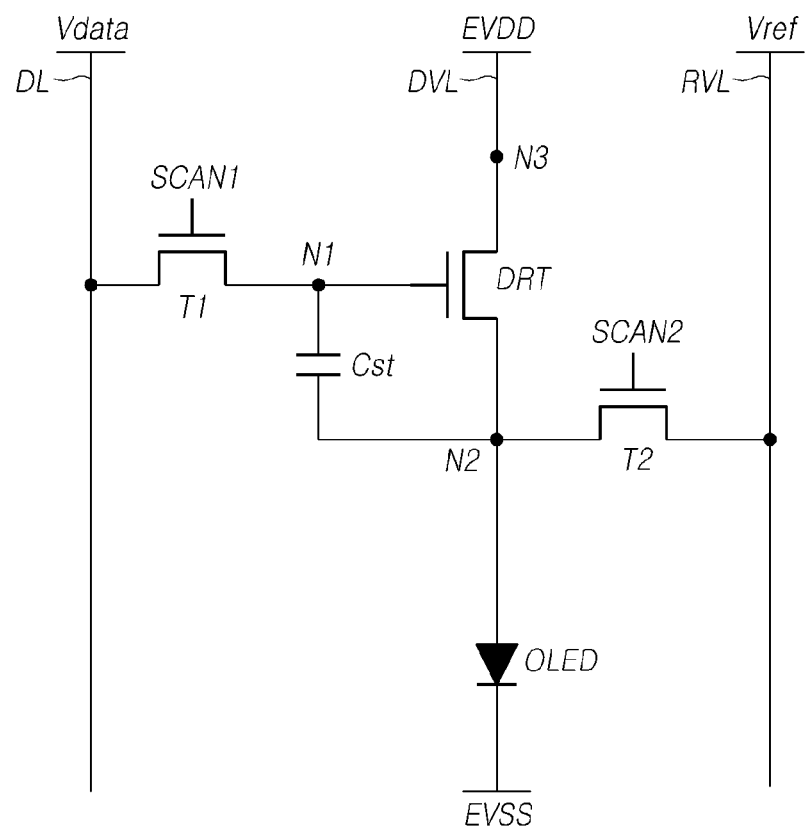
FIG. 2 is a view illustrating an example 3T (Transistor) 1C (Capacitor) structure in which one subpixel further includes a second transistor electrically connected between a second node of a driving transistor and a reference voltage line.

FIG. 2 is a view illustrating an example 3T (Transistor) 1C (Capacitor) structure in which one subpixel further includes a second transistor electrically connected between a second node of a driving transistor and a reference voltage line.

Referring to FIG. 2, a second transistor T2 may be electrically connected between a second node N2 of a driving transistor DRT and a reference voltage line RVL and receive a second scan signal SCAN2 through the gate node to be controlled of its On/Off.

An anode (also referred to as a pixel electrode) of an organic light-emitting diode OLED can be electrically connected to the second node N2 of the driving transistor DRT. A cathode (also referred to as a common electrode) of the organic light-emitting diode OLED can have a base voltage EVSS applied thereto.

The drain node or source node of the second transistor T2 may be electrically connected with the reference voltage line RVL, and the source node or drain node of the second transistor T2 may be electrically connected with the second node N2 of the driving transistor DRT.

The second transistor T2 may be turned on, e.g., in a display driving time period and be turned on in a sensing driving time period for sensing the characteristic values of the driving transistor DRT or the characteristic values of the organic light emitting diode (OLED).

In sync with a relevant driving timing (e.g., a display driving timing or an initialization timing in the sensing driving time period), the second transistor T2 may be turned on by the second scan signal SCAN2, transferring the reference voltage Vref supplied to the reference voltage line RVL to the second node N2 of the driving transistor DRT.

In sync with a relevant driving timing (e.g., a sampling timing in the sensing driving time period), the second transistor T2 may be turned on by the second scan signal SCAN2, transferring the voltage of the second node N2 of the driving transistor DRT to the reference voltage line RVL.

In other words, the second transistor T2 may control the voltage state of the second node N2 of the driving transistor DRT or transfer the voltage of the second node N2 of the driving transistor DRT to the reference voltage line RVL.

The reference voltage line RVL may be electrically connected with an analog-to-digital converter that senses the voltage of the reference voltage line RVL, converts the voltage into a digital value, and outputs sensing data including the digital value.

The analog-to-digital converter may be included in the source driver integrated circuit (SDIC) that implements the data driver DDR.

The sensing data output from the analog-to-digital converter may be used to sense the characteristic values (e.g., threshold voltage or mobility) of the driving transistor DRT or the characteristic values (e.g., threshold voltage) of the organic light emitting diode (OLED).

A capacitor Cst may be an external capacitor intentionally designed to be outside the driving transistor DRT, but not a parasite capacitor (e.g., Cgs or Cgd) which is an internal capacitor present between the first node N1 and the second node N2 of the driving transistor DRT.

The third node N3 of the driving transistor DRT can be a drain node or a source node, to which a driving voltage EVDD may be applied. The third node N3 can be electrically connected to a driving voltage line DVL, through which the driving voltage EVDD is supplied.

The storage capacitor Cst can be electrically connected between the first node N1 and the second node N2 of the driving transistor DRT to maintain a data voltage Vdata corresponding to an image signal voltage or a voltage corresponding to the data voltage Vdata during a single frame time (or a predetermined time).

Each of the driving transistor DRT, the first transistor T1, and the second transistor T2 may be a n-type transistor or p-type transistor.

The first scan signal SCAN1 and the second scan signal SCAN2 may be separate gate signals. In this case, the first scan signal SCAN1 and the second scan signal SCAN2, respectively, may be applied to the gate node of the first transistor T1 and the gate node of the second transistor T2 through different gate lines.

In some cases, the first scan signal SCAN1 and the second scan signal SCAN2 may be the same gate signals. In this case, the first scan signal SCAN1 and the second scan signal SCAN2 may be jointly applied to the gate node of the first transistor W2 and the gate node of the second transistor T2 through the same gate line.

Each subpixel structure shown in FIG. 2 is merely an example, and one or more transistors may be omitted or added and, in some cases, one or more capacitors may be added.

The plurality of subpixels may have the same structure, or some of the plurality of subpixels may have a different structure.

The brightness of the panel PNL may be varied depending on the amount of the light emitted from the organic light emitting diodes (OLEDs) arranged in the active area A/A and exposed to the outside. In other words, as the amount of the light emitted from the OLEDs and extracted increases, the brightness of the panel PNL may increase. Described below is the structure of a thin film transistor array film having a structure with enhanced light extraction.

At least one subpixel of the plurality of subpixels disposed in the active area may include at least one concave portion in the insulation film.

The organic light emitting display panel is described below in greater detail with reference to various figures.

Figure 3:
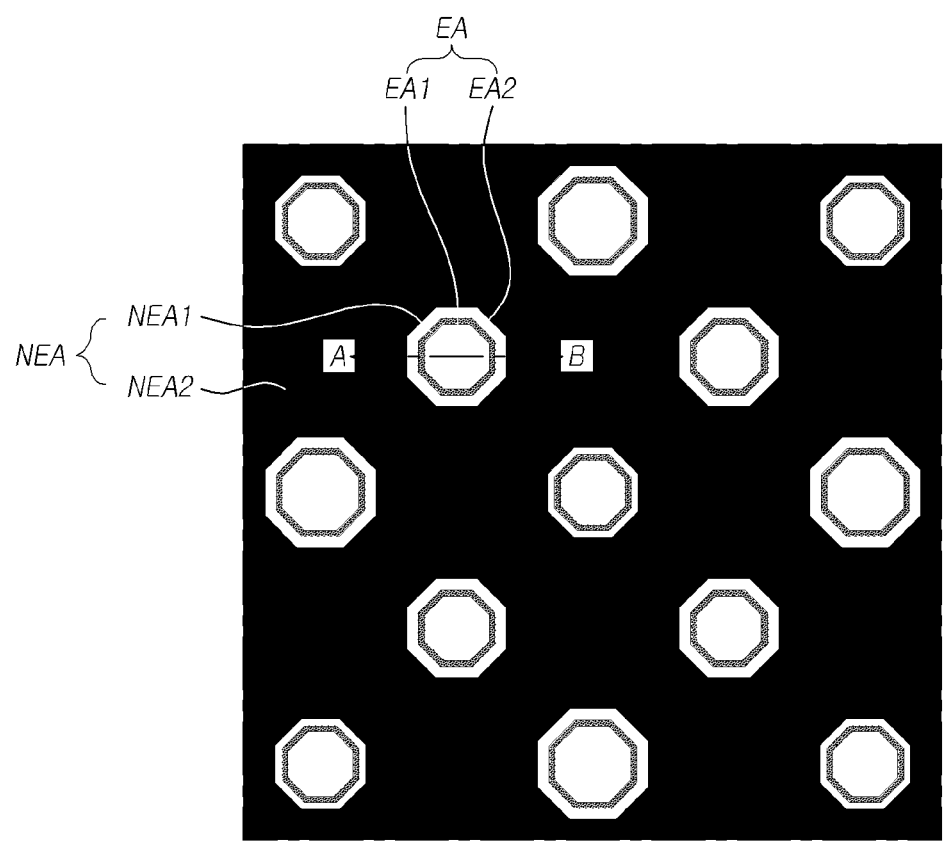
FIG. 3 is a plan view illustrating an emission area and a non-emission area included in an active area of an organic light emitting display panel according to embodiments of the disclosure.
Figure 4:
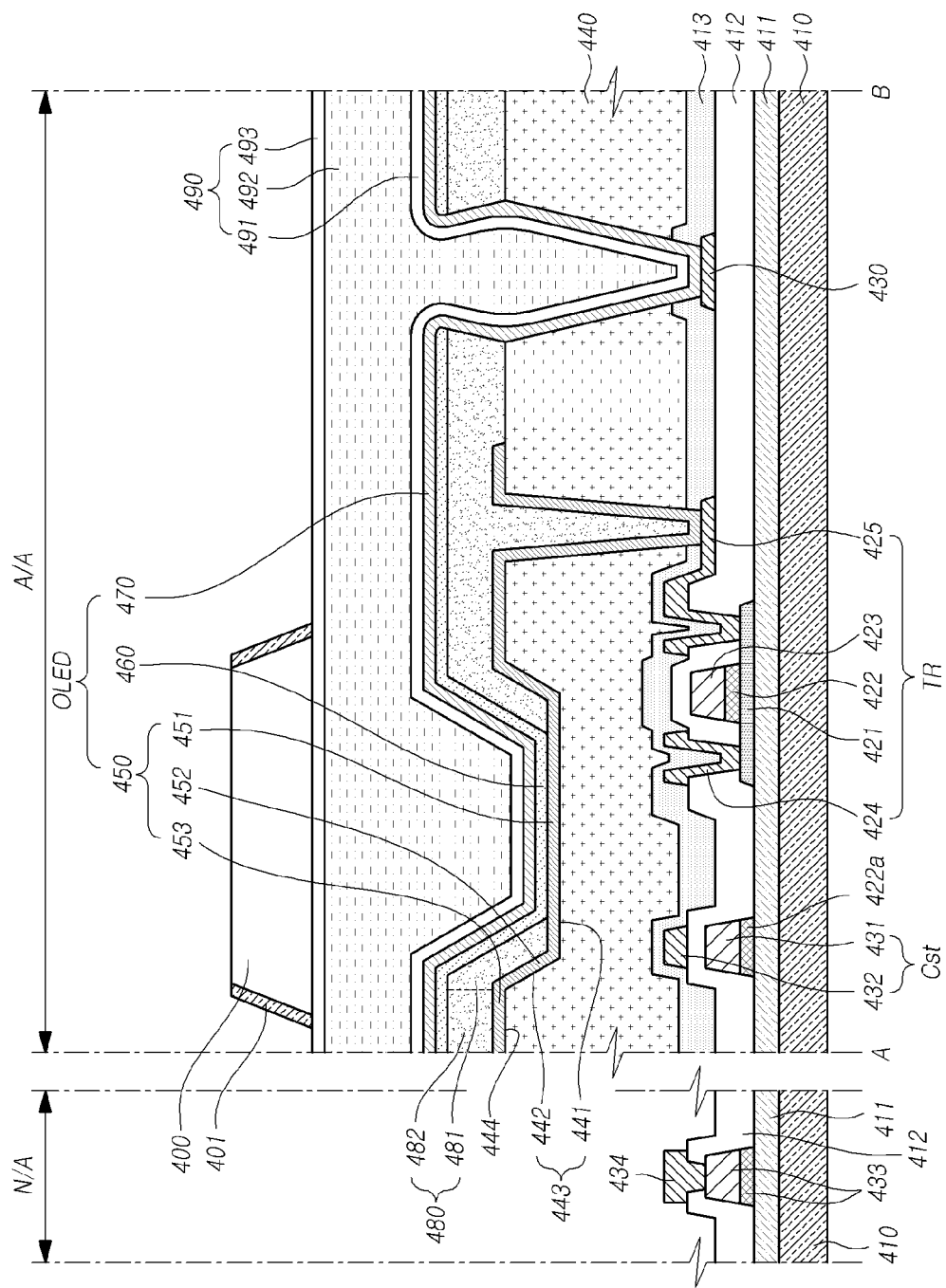
FIG. 4 is a cross-sectional view illustrating an area taken along line A-B of FIG. 3 and a portion of a pad area.

FIG. 3 is a plan view illustrating an emission area and a non-emission area included in an active area of an organic light emitting display panel according to embodiments of the disclosure. FIG. 4 is a cross-sectional view illustrating an area taken along line A-B of FIG. 3 and a portion of a pad area. FIG. 4 may illustrate only a partial configuration disposed in one subpixel SP and a partial area, e.g., a partial configuration disposed in a pad area and a partial area.

Referring to FIG. 3, a plurality of emission areas EA and a plurality of non-emission areas NEA are disposed in the active area A/A.

As shown in FIG. 3, the emission areas EA of at least two or more subpixels SP may have different sizes but embodiments of the disclosure are not limited thereto.

Each subpixel SP disposed in the active area A/A may include a plurality of light emitting areas EA, and at least one light emitting area EA may include a plurality of emission areas EA1 and EA2.

Specifically, the light emitting area EA of one subpixel SP may include a first emission are aEA1 and a second emission area EA2 surrounding the first emission area EA1.

A first non-emission area NEA1 may be disposed between the first emission area EA1 and the second emission area EA2.

In other words, the first emission area EA1 and the second emission area EA2 may be differentiated from each other by the first non-emission area NEA1.

The first non-emission area NEA1 may be smaller in size than the first emission area EA1 and the second emission area EA2.

The first non-emission area NEA1 may be in a black state when the display device is in an on state, or the first non-emission area NEA1 may have a lower brightness than the first and second emission areas EA1 and EA2 due to the light incident from at least one of the first emission area EA1 and the second emission area EA2.

As shown in FIG. 3, the first emission area EA1, second emission area EA2, and first non-emission area NEA1 each may be octagonal in the plan view. However, embodiments of the disclosure are not limited thereto. For example, the first emission area EA1, second emission area EA2, and first non-emission area NEA1 each may be shaped as a circle, ellipse, or polygon, e.g., a triangle, square, or hexagon, or a combination thereof, in shape.

A pair of first and second emission areas EA1 and EA2 may be spaced apart from another pair of first and second emission areas EA1 and EA2, and the second non-emission area NEA2 may be disposed therebetween.

The second non-emission area NEA2 may be an area corresponding in whole or part to a circuit area where circuitry for driving the first and second emission areas EA1 and EA2 are disposed.

When the display device is in an on state, the second non-emission area NEA2 may be in a black state or may have a lower brightness than the first and second emission areas EA1 and EA2 due to the light incident from the second emission area EA2.

When the first non-emission area NEA1 and the second non-emission area NEA2 have a lower brightness than the first and second emission areas EA1 and EA2, the brightness of the first non-emission area NEA1 may be higher than the brightness of the second non-emission area NEA2, but embodiments of the disclosure are not limited thereto.

Referring to FIG. 4, a transistor TR disposed on a substrate 410 and an organic light emitting diode (OLED) electrically connected with the transistor TR are disposed in the active area A/A (the area taken along line A-B). At least one pad area is present in the non-active area N/A.

The transistor TR includes an active layer 421, a gate electrode 423, a source electrode 424, and a drain electrode 425.

The organic light emitting diode (OLED) includes a first electrode 450, an organic layer 460 including a light emission layer, and a second electrode 470. The first electrode 450 may be an anode electrode, and the second electrode 470 may be a cathode electrode, but embodiments of the disclosure are not limited thereto.

Specifically, a buffer layer 411 is disposed on the substrate 410. The active layer 421 of the transistor TR is disposed on the buffer layer 411. A gate insulation film 422 is disposed on the active layer 421, and a gate electrode 423 is disposed on the gate insulation film 422.

Although not shown in FIG. 4, the active layer 421 may include a channel area, and the channel area of the active layer 421 may overlap the gate insulation film 422 and the gate electrode 423, according to embodiments of the disclosure. In other words, the gate insulation film 422 and the gate electrode 423 may be disposed on the channel area of the active layer 421.

An inter-layer insulation film 412 is disposed on the gate electrode 423. The source electrode 424 and the drain electrode 425 are disposed on the inter-layer insulation film 412. The source electrode 424 and the drain electrode 425 may be spaced apart from each other on the inter-layer insulation film 412. The source electrode 424 and the drain electrode 425 each may contact the active layer 421 through a hole formed in the inter-layer insulation film 412.

Although the transistor TR may be disposed on the substrate 410 in the above-described structure, the transistor structure of the disclosure is not limited thereto.

For example, the gate electrode 423 may be disposed on the substrate 410, the active layer 421 may be disposed on the gate electrode 423, the source electrode 424 may be disposed to overlap an end of the active layer 421, and the drain electrode 425 may be disposed to overlap the opposite end of the active layer 421 on the active layer 421.

A protection film 413 may be disposed while covering the transistor TR.

An insulation film 440 may be disposed on the protection film 413.

The insulation film 440 may be formed of an organic material, but embodiments of the disclosure are not limited thereto.

The insulation film 440 may have at least one concave portion 443 in one subpixel area. The insulation film 440 may have a surrounding portion 444 that surrounds the concave portion 443 and is positioned around the concave portion 443. The concave portion 443 may include a flat portion 441 and an inclined portion 442 surrounding the flat portion 441.

The surface of the flat portion 441 of the concave portion 443 may be parallel with the surface of the substrate 410, and the inclined portion 442 may surround the flat portion 441, and a predetermined angle may be formed between the surface of the inclined portion 442 and the surface of the substrate 410. In other words, the surface of the inclined portion 442 may be not parallel with the surface of the substrate 410.

The insulation film 440 may have a contact hole spaced apart from the concave portion 443.

In at least one subpixel area, the first electrode 450 may be disposed on the concave portion 443 and surrounding portion 444 of the insulation film 440.

In the area overlapping the concave portion 443, the first electrode 450 includes a first area 451 in which the top surface of the first electrode 450 is parallel with the surface of the substrate 410 and a second area 452 extending from the first area 451. In the second area 452, a predetermined angle is formed between the top surface of the first electrode 450 and the substrate 410. In other words, the surface of the second area 452 may be not parallel with the surface of the substrate 410. The first electrode 450 includes a third area 453 extending from the second area 453 and, in the third area 453, the top surface of the first electrode 450 is parallel with the surface of the substrate 410. The third area 453 may be an area overlapping the surrounding portion 444 of the concave portion 443.

As described above, in at least one subpixel area, the insulation film 440 may include at least one contact hole spaced apart from the concave portion 443, and the transistor TR may be electrically connected with the first electrode 450 of the organic light emitting diode (OLED) through the contact hole of the insulation film 440.

Specifically, the first electrode 450 may be electrically connected with the source electrode 424 or drain electrode 425 of the transistor TR.

A bank 480 may be disposed on portions of the insulation film 440 and the first electrode 450 as shown in FIG. 4.

The bank 480 may include a first portion 481 disposed on the first electrode 450 in an area corresponding to a portion of the concave portion 443 provided in the insulation film 440 and a second portion 482 disposed on the insulation film 440 and the first electrode 450 in an area corresponding to the surrounding portion 444 provided in the insulation film 440.

The bank 480 may be disposed to expose a portion of the top surface of the first electrode 450 in the area overlapping the concave portion 443. In other words, at least one subpixel may have an area in which the first electrode 450 does not overlap the bank 480.

The organic layer 460 of the organic light emitting diode (OLED) with at least one light emission layer may be disposed on the first electrode 450 not overlapping the bank 480. The organic layer 460 may be disposed on the first electrode 450 and the bank.

The second electrode 470 of the OLED may be disposed on the organic layer 460.

The organic layer 460 of the organic light emitting diode (OLED) may be formed by deposition or coating featuring straightness. For example, the organic layer 460 may be formed by physical vapor deposition (PVD), e.g., evaporation.

Formed by the method, the organic layer 460 may have a first thickness in an area having a predetermined angle from the horizontal surface and a second thickness in an area parallel with the horizontal surface, wherein the first thickness is smaller than the second thickness.

For example, the thickness of the organic layer 460 disposed in the area corresponding to the inclined portion 442 of the concave portion 443 may be smaller than the thickness of the organic layer 460 disposed on the top surface of the first electrode 450 exposed by the bank 480. Further, the thickness of the organic layer 460 disposed in the area corresponding to the inclined portion 442 of the concave portion 443 may be smaller than the thickness of the organic layer 460 disposed on the surrounding portion 444.

Thus, when the organic light emitting diode (OLED) is driven, the area where the thickness of the organic layer 460 is relatively small, i.e., the area corresponding to the inclined portion 442 of the concave portion 443, may have the highest current density, and a strong electric field may be applied to the area corresponding to the inclined portion 442 of the concave portion 443.

The light emission characteristics of the organic light emitting diode (OLED) in the area corresponding to the inclined portion 442 of the concave portion 443 may be rendered to differ from the light emission characteristics of the organic light emitting diode (OLED) in the area corresponding to the flat portion 441 of the concave portion 443, and the OLED may be deteriorated.

According to an embodiment of the disclosure, as the bank 480 is disposed to cover the inclined portion 442 of the concave portion 443, the OLED may be prevented from being deteriorated in the area corresponding to the inclined portion 442 of the concave portion 443, and so is the phenomenon that the light emission characteristics are rendered to differ per area.

However, the thickness conditions for the organic layer 460, according to embodiments of the disclosure, are not limited thereto, but the organic layer 460 may rather have a corresponding thickness per position.

Meanwhile, the first electrode 450 may include a light reflective metal. Although FIG. 4 illustrates a configuration in which the first electrode 450 is a single layer, embodiments of the disclosure are not limited thereto, but the first electrode 450 may be formed in a multi-layer structure. When the first electrode 450 has a multi-layer structure, at least one layer may include a light reflective metal.

For example, the first electrode 450 may include, but is not limited to, at least any one of aluminum, neodymium, nickel, titanium, tantalum, copper (Cu), silver (Ag), and an aluminum alloy.

The second electrode 470 may include a light-transmissive or semi-light transmissive, conductive material. For example, the second electrode 470 may include at least one kind of transparent, conductive oxide, such as indium tin oxide (ITO), indium zinc oxide (IZO), indium tin zinc oxide (ITZO), zinc oxide, or tin oxide, or may include a semi-light transmissive metal, such as magnesium, silver (Ag), or an alloy of magnesium and silver. When the second electrode 470 includes a semi-light transmissive metal, the thickness of the second electrode 470 may be smaller than the thickness of the first electrode 450.

As shown in FIG. 4, an auxiliary electrode 430 (which may also be referred to as an auxiliary wire) contacting the second electrode 470 may further be disposed in the area corresponding to the second non-emission area NEA2 in the active area A/A.

Specifically, the auxiliary electrode 430 may be disposed on the inter-layer insulation film 412. The protection film 413, insulation film 440, and bank 480 may have a hole to expose the auxiliary electrode 430. The second electrode 470 may contact the auxiliary electrode 430 through the hole formed in the protection film 413, insulation film 440, and bank 480 to expose the auxiliary electrode 430.

When the organic light emitting display panel is a large-size display panel, a voltage drop may occur due to the resistance of the second electrode 470, causing a difference in brightness between the periphery and center of the panel. However, in the organic light emitting display panel, according to the disclosure, the auxiliary electrode 430 contacting the second electrode 470 may prevent a voltage drop. This may prevent a difference in brightness which may arise when the organic light emitting display panel is a large-size panel.

Although FIG. 4 illustrates a configuration in which one auxiliary electrode 430 is disposed in each subpixel SP, embodiments of the disclosure are not limited thereto. For example, one auxiliary electrode 430 may be disposed per multiple subpixels SP.

The position of the auxiliary electrode 430 shown in FIG. 4 is merely an example and is not limited thereto.

Unless the organic light emitting display panel according to an embodiment of the disclosure is a large-size panel, the auxiliary electrode 430 may be omitted.

To allow the second electrode 470 and the auxiliary electrode 430 to contact each other, the bank 480 may have such a structure that prevents the material of the organic layer 460 from being deposited on the auxiliary electrode 430 in the process of forming the organic layer 460.

Specifically, as shown in FIG. 4, the bank 480 may be shaped to widen as it goes away from the substrate 410 in the area surrounding the hole exposing the auxiliary electrode 430. In other words, as the bank 480 goes farther away from the substrate 410, the mouth of the hole of the bank 480 exposing the auxiliary electrode 430 may become narrower.

As the process for forming the organic layer 460, deposition or coating may be adopted in which the source material features straightness. For example, evaporation may be used. As the process of forming a second electrode 470, deposition or coating may be used in which the source material has irregular directivity. For example, sputtering may be put to use.

Since the mouth of the hole of the bank 480 exposing the auxiliary electrode 430 is narrow, the organic layer 460 may not be disposed on the auxiliary electrode 430 due to the processing properties of the organic layer 460. Since the source material of the second electrode 470 may enter the hole due to the processing properties of the second electrode 470 although the mouth of the hole of the bank 480 is narrow, the second electrode 470 may be formed also on the auxiliary electrode 430.

As shown in FIG. 4, a storage capacitor Cst may be disposed in the active area A/A. The storage capacitor Cst may include a first storage capacitor electrode 431 disposed on the same layer as the gate electrode 423 and a second storage capacitor electrode 432 disposed on the same layer as the source electrode 424 and the drain electrode 425, but the structure of the storage capacitor Cst of the disclosure is not limited thereto.

According to an embodiment of the disclosure, the organic light emitting display panel includes a pad area disposed in the non-active area N/A. A plurality of pad electrodes 433 and 434 may be disposed in the pad area.

For example, a first pad electrode 433 may be disposed on a plurality of insulation films 411 and 412 disposed in the pad area. The inter-layer insulation film 412 may be disposed on the first pad electrode 433 to expose a portion of the top surface of the first pad electrode 433. The second pad electrode 434 contacting the first pad electrode 433 may be disposed on the first pad electrode 433 and the inter-layer insulation film 412.

Although not shown in FIG. 4, the second pad electrode 434 may be electrically connected with various circuit films.

At least one encapsulation layer 490 may be disposed on the second electrode 470 of the OLED.

For example, the encapsulation layer 490 may include a first encapsulation layer 491 disposed on the second electrode 470, a second encapsulation layer 492 disposed on the first encapsulation layer 491, and a third encapsulation layer 493 disposed on the second encapsulation layer 492.

As such, when the encapsulation layer 490 is formed in a multi-layered structure, at least one layer thereof may include an inorganic insulation material, and at least one other layer thereof may include an organic insulation material.

According to an embodiment of the disclosure, although the first encapsulation layer 491 and the third encapsulation layer 493 include an inorganic insulation material, and the second encapsulation layer 492 includes an organic insulation material, embodiments of the disclosure are not limited thereto.

The encapsulation layer 490 may be disposed on the organic light emitting diode (OLED) to prevent infiltration of moisture or foreign bodies into the organic light emitting diode (OLED).

Although FIG. 4 illustrates a configuration in which the encapsulation layer 490 is disposed in the active area A/A, embodiments of the disclosure are not limited thereto, but the encapsulation layer 490 may rather extend up to a portion of the non-active area N/A.

At least one structure 400 may be disposed on the third encapsulation layer 493.

The structure 400 may be disposed to overlap an area where at least one first electrode 450 and the bank 480 do not overlap each other.

A light reflecting member 401 may be disposed on at least one surface of the structure 400. For example, the light reflecting member 401 may be disposed to surround the side surface of the structure 400 and to expose the entire top surface of the structure 400.

Although the light reflecting member 401 may include a reflective metal, embodiments of the disclosure are not limited thereto but the light reflecting member 401 may include any material capable of reflecting light.

The light reflecting member 401 may be disposed in a non-emission area NEA inside the active area A/A. Thus, a shrinkage in the light emitting area EA which may occur when the light reflecting member 401 is disposed in the light emitting area EA may be prevented.

The position of the light reflecting member 401 is not limited to that in the structure of FIG. 4.

Other positions of the light reflecting member 401 are discussed below with reference to FIG. 5.

Figure 5:
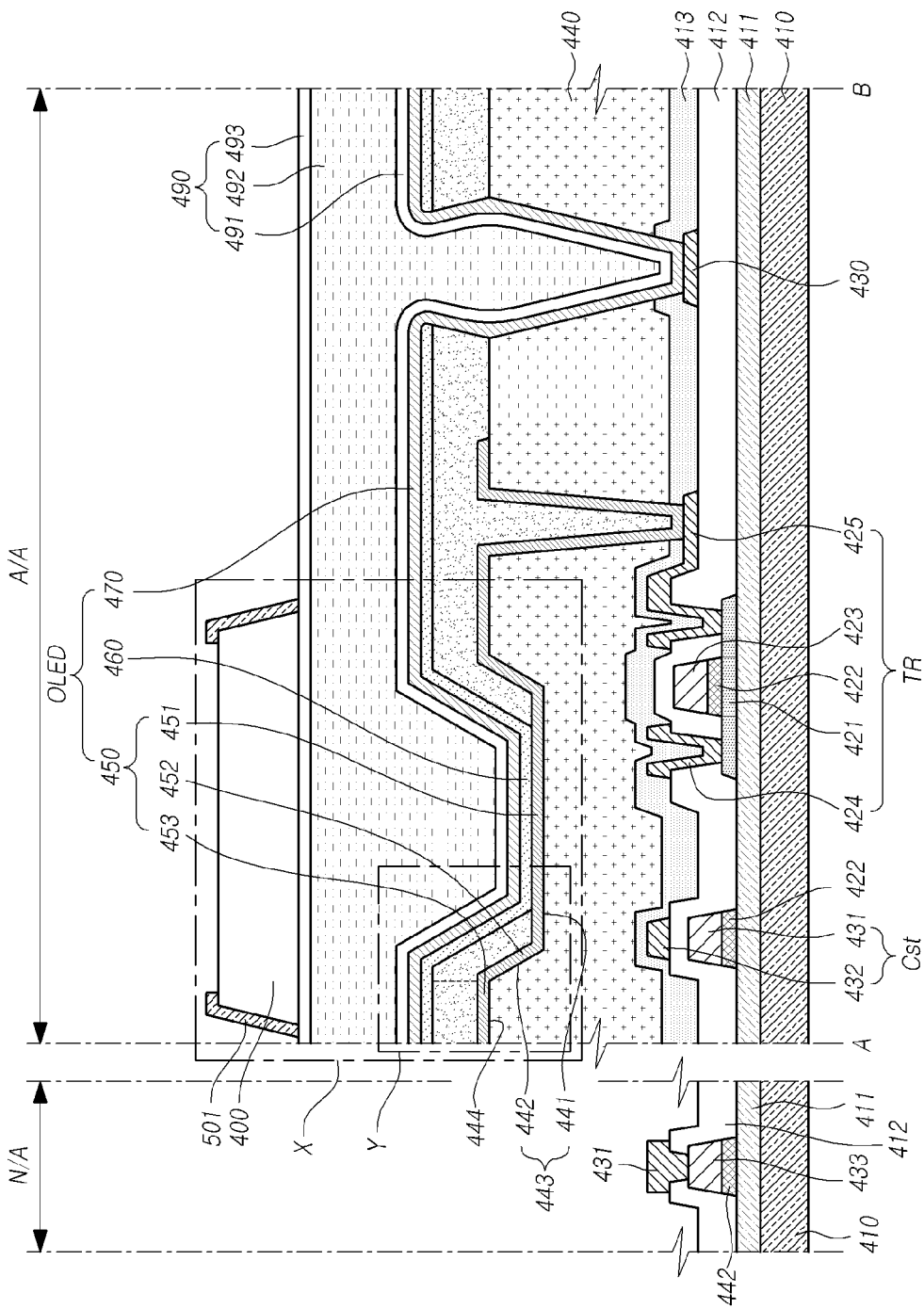
FIG. 5 is a view illustrating the light reflecting member in another position.

FIG. 5 is a view illustrating the light reflecting member in another position.

Substantially the same configurations and effects as those described above are not repeatedly described below.

Referring to FIG. 5, a light reflecting member 501 may be disposed to surround the side surface of the structure 400 and to overlap a portion of the top surface of the structure 400.

The light reflecting member 501 may be disposed in a non-emission area NEA inside the active area A/A.

The light reflecting member 501 plays a role to allow light (e.g., light leaks that deteriorate the color gamut), which is absorbed by other component or travels over to other subpixel without being extracted to the outside of the organic light emitting display device, to be extracted to the outside of the organic light emitting display device.

According to an embodiment of the disclosure, the position of the light reflecting member 501 and the path along which the light emitted from the organic light emitting diode (OLED) is extracted to the outside of the organic light emitting display device are discussed below with reference to the drawings.

Figure 6:
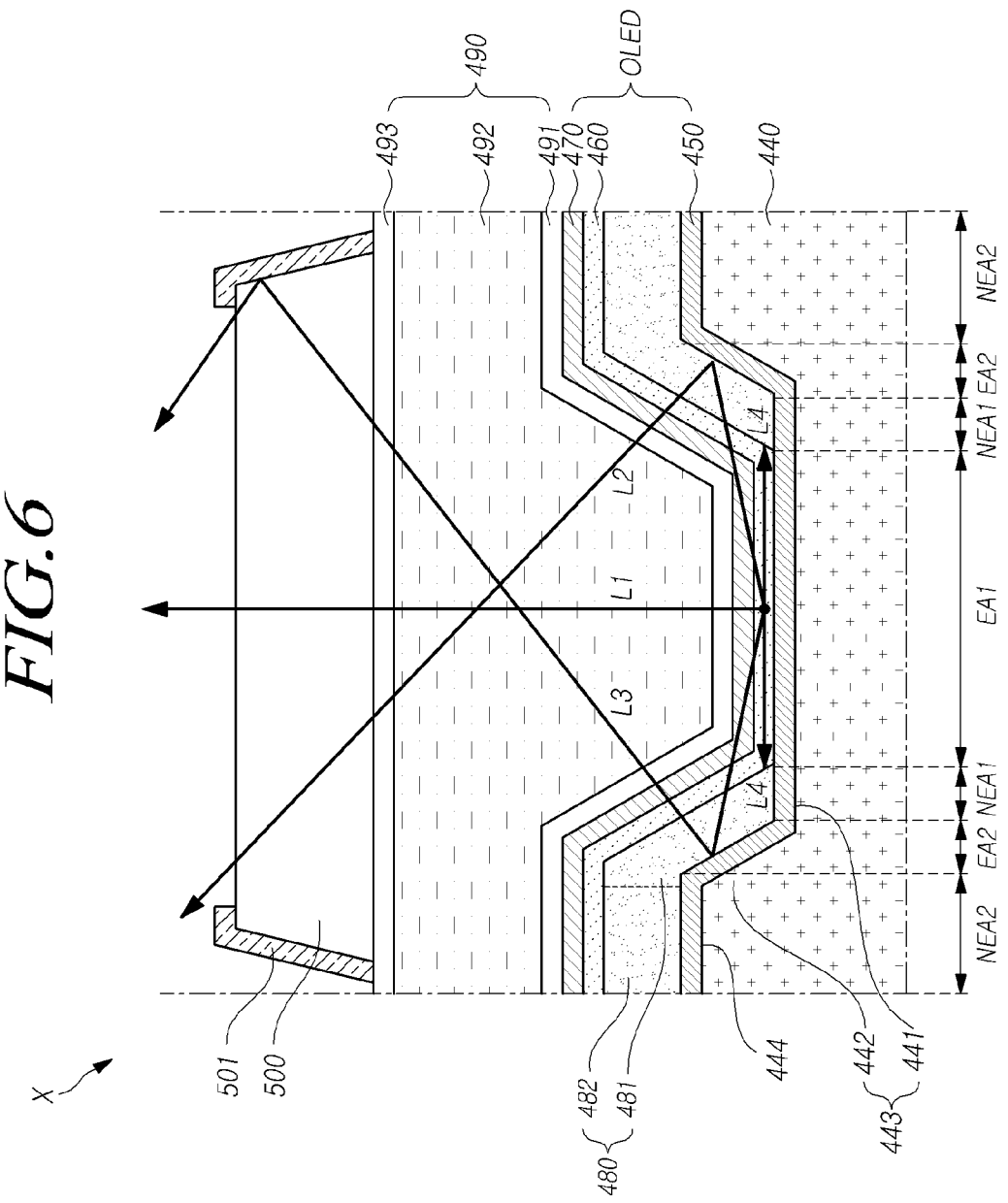
FIG. 6 is an enlarged view illustrating area X of FIG. 5.
Figure 7:
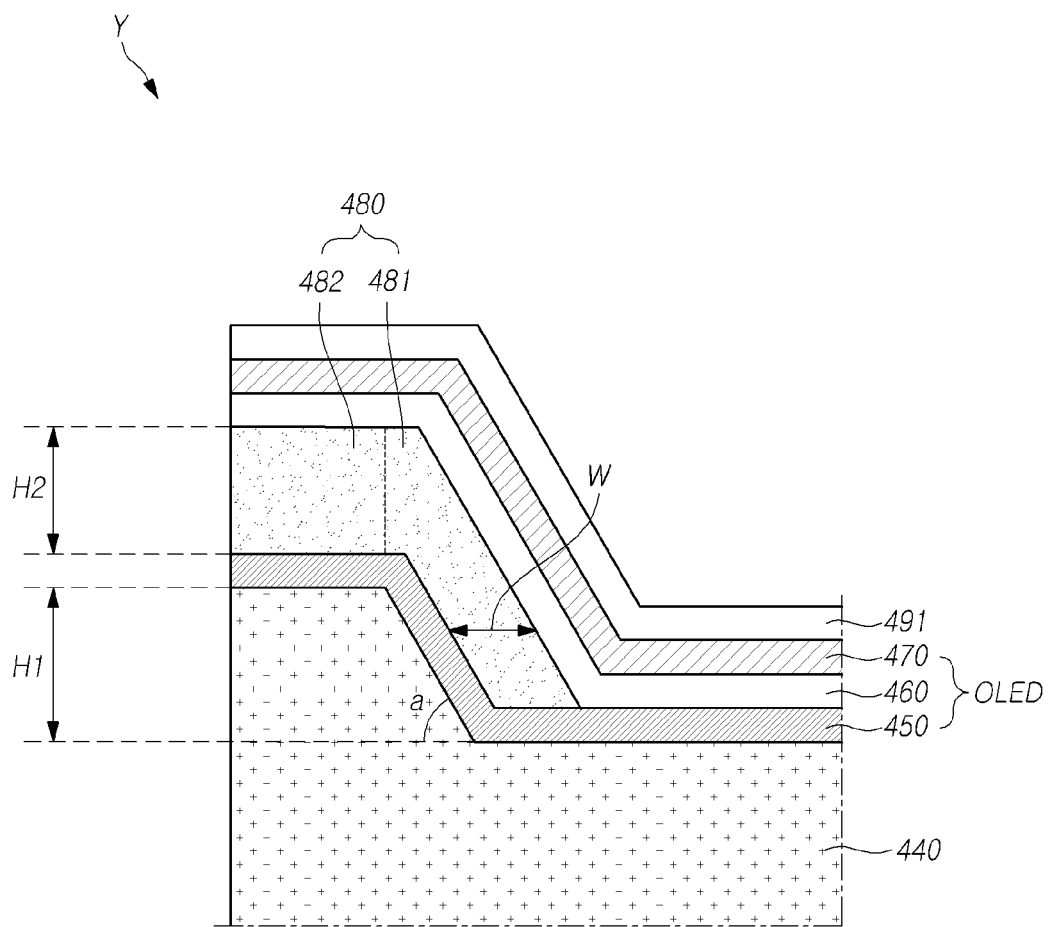
FIG. 7 is an enlarged view illustrating area Y of FIG. 5.

FIG. 6 is an enlarged view illustrating area X of FIG. 5.
FIG. 7 is an enlarged view illustrating area Y of FIG. 5.

Substantially the same configurations and effects as those described above are not repeatedly described below.

Referring to FIG. 6, at least one subpixel SP may include at least one light emitting area EA, and one light emitting area EA may include at least two emission areas EA1 and EA2. One non-emission area NEA1 may be disposed between the two emission areas EA1 and EA2.

Specifically, a first emission area EA1 may be an area corresponding to a portion of the concave portion 443 of the insulation film 440.

In another aspect, the first emission area EA1 may be an area that does not overlap the first portion 481 of the bank 480 in the flat portion 441 of the concave portion 443.

The first emission area EA1 may be an area in which part L1 of the light emitted from the organic layer 460 is extracted via the organic layer 460 and the second electrode 470 to the outside of the panel PNL.

The first emission area EA1 may be an area in which part L1 (which may be hereinafter referred to as first light) of the light emitted from the organic layer 460 arrives at the first electrode 450, is reflected by the first electrode 450, and is extracted via the organic layer 460 and the second electrode 470 to the outside of the panel PNL.

Specifically, the first light L1 emitted from the organic layer 460 sequentially passes through the second electrode 470 of the organic light emitting diode (OLED), the encapsulation layer 490, and the structure 400 and is extracted to the outside of the panel.

In this case, the structure 400 may play a role to convert the wavelength of the light emitted from the organic layer 460 into a wavelength of a specific color of light. For example, the light emitted from the organic layer 460 has a wavelength of blue light, the light may be converted into light of a wavelength of red or green light after passing through the structure 400 and the red or green light may be extracted to the outside of the panel. In other words, the structure 400 may play a role as a color filter, but embodiments of the disclosure are not limited thereto.

For example, the light emitted from the organic layer 460 may have a wavelength of red light and, after passing through the structure 400, the light may also have a wavelength of red light. In this case, the structure 400 may include the same material as the insulation film 440, but embodiments of the disclosure are not limited thereto. For example, the structure 400 may include any material that may convert the wavelength of the light emitted from the organic layer 460 into a wavelength of other color of light or that does not significantly absorb the light emitted from the organic layer 460.

The first emission area EA1 may be surrounded by the first non-emission area NEA1.

The first non-emission area NEA1 may correspond to the area in which the bank 480 overlaps the flat portion 441 of the concave portion 443. Specifically, the first non-emission area NEA1 may correspond to the area in which the first portion 481 of the bank 480 overlaps the flat portion 441 of the concave portion 443.

The first non-emission area NEA1 may be an area in which part L4 of the light emitted from the organic layer 460 is directed to the area corresponding to the first portion 481 of the bank 480 but the light L4 may not be extracted to the outside. In other words, the first non-emission area NEA1 may be an area in which the light emitted from the organic layer 460 in the direction parallel with the flat portion 441 arrives at the first electrode 450 but is trapped in the subpixel rather than reflected to the outside.

The first non-emission area NEA1 may be in a black state when the display device is in an on state, or the first non-emission area NEA1 may have a lower brightness than the first and second emission areas EA1 and EA2 due to the light incident from at least one of the first emission area EA1 and the second emission area EA2. For example, the first non-emission area NEA1 disposed between the first emission area EA1 and second emission area EA2 may be an area where the visible rays from the first emission area EA1 and the visible rays from the second emission area EA2 are mixed, but embodiments of the disclosure are not limited thereto.

The second emission area EA2 may be disposed to surround the first non-emission area NEA1. The second emission area EA2 may be an area corresponding to the area in which the first electrode 450 overlaps the inclined portion 442 of the concave portion 443. In another aspect, the second emission area EA2 may be an area corresponding to the second area 452 of the first electrode 450.

Part L2 (which may be hereinafter referred to as second light) of the light emitted from the organic layer 460 may be directed to the area corresponding to the second area 452 of the first electrode 450.

Specifically, the second light L2 travels through the first portion 481 of the bank 480 to the area corresponding to a portion of the second area 452 of the first electrode 450. Upon reaching the first electrode 450, the second light L2 is reflected by the first electrode 450 and is extracted through the first portion 481 of the bank 480, organic layer 460, and second electrode 470 to the outside.

Specifically, the second light L2 emitted from the organic layer 460 sequentially passes through the second electrode 470 of the organic light emitting diode (OLED), the encapsulation layer 490, and the structure 400 and is extracted to the outside of the panel.

Of the light emitted from the organic layer 460, third light L3 may also be directed to an area corresponding to the second area 452 of the first electrode 450.

Specifically, the third light L3 reaches through the first portion 481 of the bank 480 to the area corresponding to a portion of the second area 452 of the first electrode 450. Upon reaching the first electrode 450, the third light L3 is reflected by the first electrode 450 and passes through the first portion 481 of the bank 480 and the organic layer 460 and reaches the second electrode 470.

Thereafter, the third light L3 may sequentially pass through the second electrode 470 of the organic light emitting diode (OLED), the encapsulation layer 490, and the structure 400 and arrive at the light reflecting member 501 disposed on one side surface of the structure 400. The third light L3 may be reflected by the light reflecting member 501 to change its path and is then extracted through the structure 400 to the outside of the panel.

As the second and third light L2 and L3 are so extracted, the second emission area EA2 may exist, and part of the second and third light L2 and L3 may be extracted in the area corresponding to the second emission area EA2.

The second non-emission area NEA2 may be disposed to surround the second emission area EA2. The second non-emission area NEA2 may correspond to the area in which the second portion 482 of the bank 480 is disposed.

In the organic light emitting display panel according to embodiments of the disclosure, the inclined portion 442 of the concave portion 443 and the bank 480 disposed on the inclined portion 442 of the concave portion 443 may have specific conditions to increase the amount of light extracted from the second emission area EA2.

Referring to FIG. 7, the height H1 of the inclined portion 442 of the insulation film 440 (or the depth of the concave portion) may be 0.7 μm or more. The height H1 of the inclined portion 442 means the minimum distance from the line extending in parallel with the surface of the substrate 410, from the surface of the flat portion 441 of the concave portion 443 to the surrounding portion 444.

According to an embodiment of the disclosure, the height H1 of the insulation film 440 where the inclined portion 442 of the concave portion 443 is positioned is not limited to the above-described value. For example, the height H1 may be any height at which the components under the insulation film 440 are not exposed by the concave portion 443 of the insulation film 440.

The height H1 of the inclined portion 442 may be larger than the height of the bank 480 disposed on the surrounding portion 444. In another aspect, the height H1 of the inclined portion 442 may be larger than the height of the second portion 482 of the bank 480.

As such, as the height H1 of the inclined portion 442 increases, the amount of light reflected in the second area 452 of the first electrode 450 increases, enhancing light extraction efficiency.

The angle a between the inclined portion 442 of the concave portion 443 and the horizontal surface may be not less than 27° and less than 80°.

When the angle a is less than 27°, the light emitted from the organic layer 460 may fail to arrive at the first electrode 450 disposed on the inclined portion 442 but may rather be delivered to another adjacent subpixel, causing color mixing, or may be trapped in the panel PNL without being extracted to the outside.

When the angle a exceeds 80°, an open circuit may occur in, e.g., the first electrode 450 disposed on the inclined portion of the insulation film 440.

In the area corresponding to the inclined portion 442 of the concave portion 443, the distance W between the bank 480 and the surface of the first electrode 450 may be not more than 3.2 μm, not more than 2.6 μm, or not more than 2.0 μm.

In another aspect, the distance W between the bank 480 and the surface of the first electrode 450 in the second area 452 of the first electrode 450 may be not more than 3.2 μm, not more than 2.6 μm, or not more than 2.0 μm.

As W decreases, the first emission area EA1 may be expanded, and the optical path of the light reflected and extracted from the second area 452 of the first electrode 450 may be shortened, enhancing light extraction efficiency. Thus, the lower limit of W, although not particularly limited, may be not less than 0.1 μm, not less than 0.3 μm, or not less than 0.5 μm.

By so adjusting the range of W as above, the first emission area EA1 may be enlarged, and light extraction efficiency may be enhanced in the organic light emitting display panel.

Of the light emitted from the organic layer 460, the second and third light L2 and L3 arriving at the area corresponding to a portion of the second area 452 of the first electrode 450 passes through the bank 480 at least two times until it is extracted to the outside of the panel.

Where the light is extracted through the above-described structure 400 to the outside of the panel, and the structure 400 plays a role as a color filter, the color coordinates of the second emission area EA2 which are generated by the second and third light L2 and L3 may correspond to the color coordinates of the first emission area EA1.

Where the light is extracted through the above-described structure 400 to the outside of the panel, and the structure 400 contains a material corresponding to the insulation film 440, the color coordinates of the second emission area EA2 may differ from the color coordinates of the first emission area EA1.

In particular, when the bank 480 includes a colored organic, or inorganic, material, the light of a short wavelength in the visible light wavelength spectrum may be absorbed and, thus, does not pass through the bank 480 and the second emission area EA2 where the second and third light L2 and L3 is extracted, and the color coordinates of the first emission area EA1 where the first light L1 is extracted to the outside may be varied. For example, the color coordinates of the second emission area EA2 may be shifted to a longer wavelength band than that for the color coordinates of the first emission area EA1, but embodiments of the disclosure are not limited thereto.

Although the description made above in connection with FIGS. 4 to 7 focuses primarily on the structure where the organic layer 460 of the organic light emitting diode (OLED) overlaps the first electrode 450 and bank 480 in the active area A/A and is disposed to expose a portion of the top surface of the auxiliary electrode 430, embodiments of the disclosure are not limited thereto.

Figure 8:
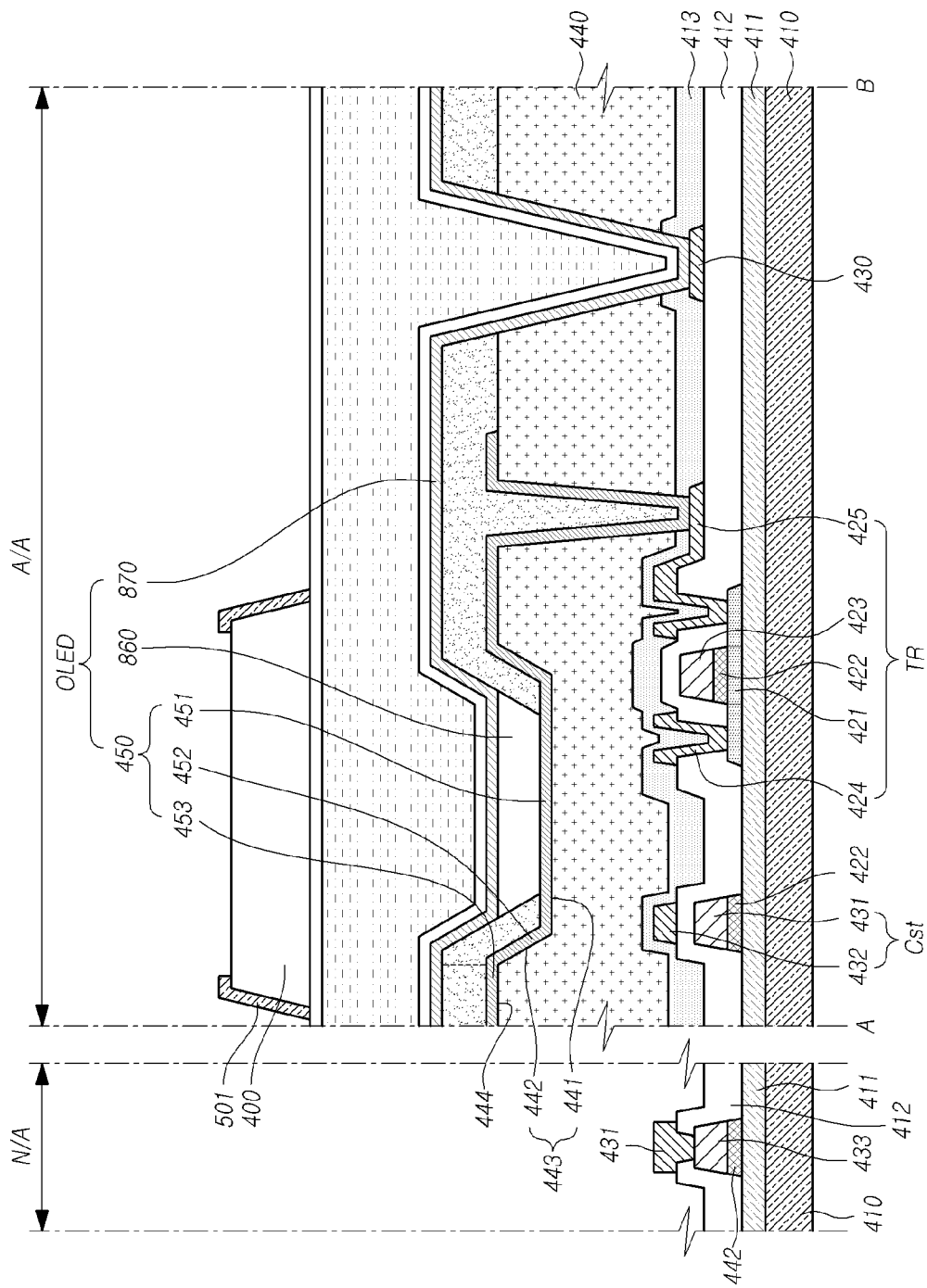
FIG. 8 is a cross-sectional view illustrating an organic light emitting display device according to another embodiment of the disclosure.

For example, the position of the organic layer may be changed as shown in FIG. 8.

FIG. 8 is a cross-sectional view illustrating an organic light emitting display device according to another embodiment of the disclosure.

Substantially the same configurations and effects as those described above are not repeatedly described below.

Referring to FIG. 8, an organic layer 860 of an organic light emitting diode (OLED) may be disposed on the first electrode 450, e.g., the top surface of the first electrode 450 which does not overlap the battery 480.

A second electrode 870 may be disposed to cover the organic layer 860 and the battery 480.

While the organic layer 460 of FIGS. 4 to 7 emits light of colors corresponding to each other in different subpixels, the organic layer 860 of FIG. 8 may emit different colors of light in at least two subpixels, but embodiments of the disclosure are not limited thereto.

The organic light emitting display device according to an embodiment of the disclosure may include a plurality of subpixels disposed in the active area A/A, and the structure and the light reflecting member may be disposed in various manners corresponding to the plurality of subpixels.

This is discussed below with reference to FIGS. 9 to 11.

Figure 9:
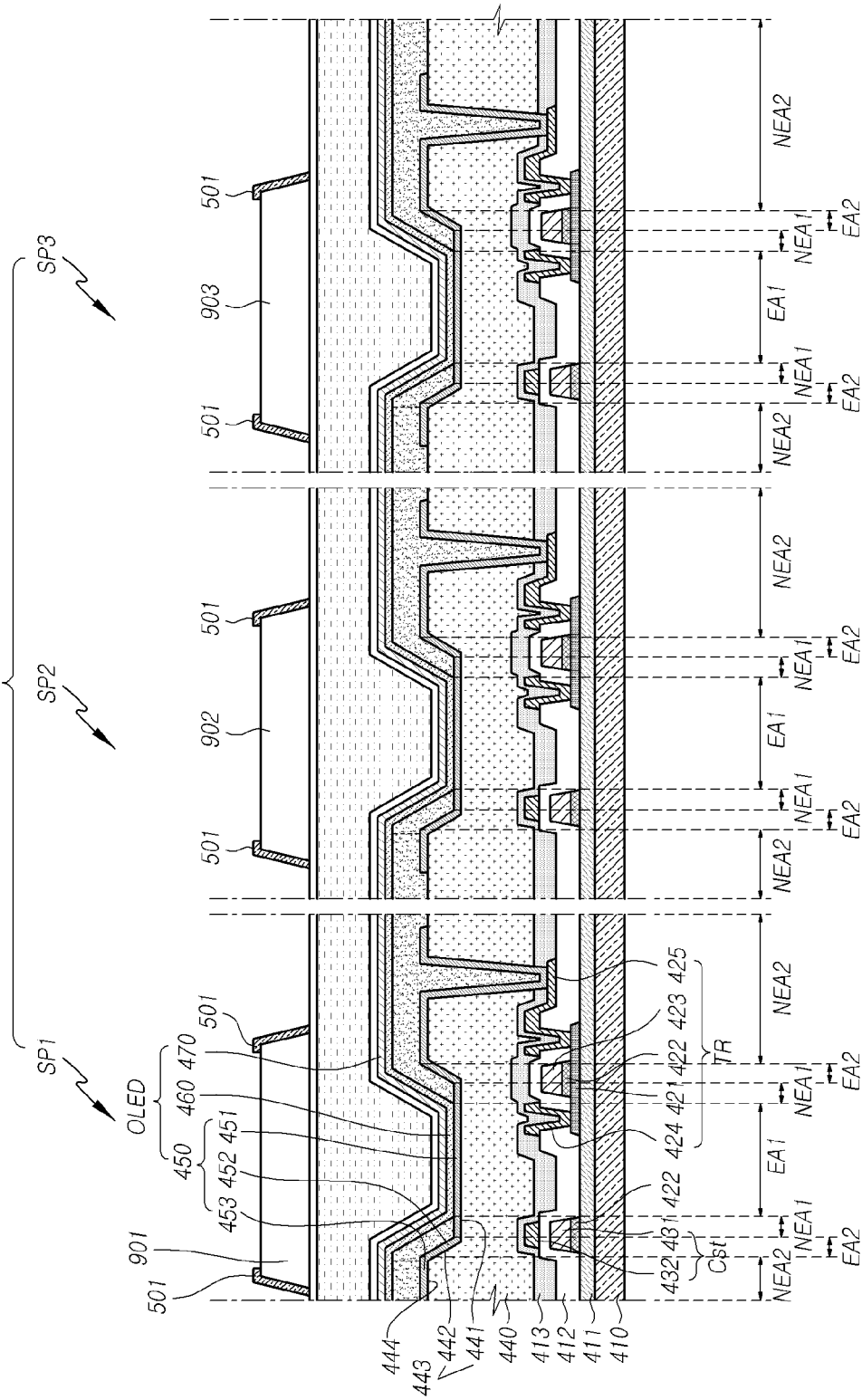
FIGS. 9 to 11 are cross-sectional views illustrating an organic light emitting display device according to yet other embodiments of the disclosure.
Figure 10:
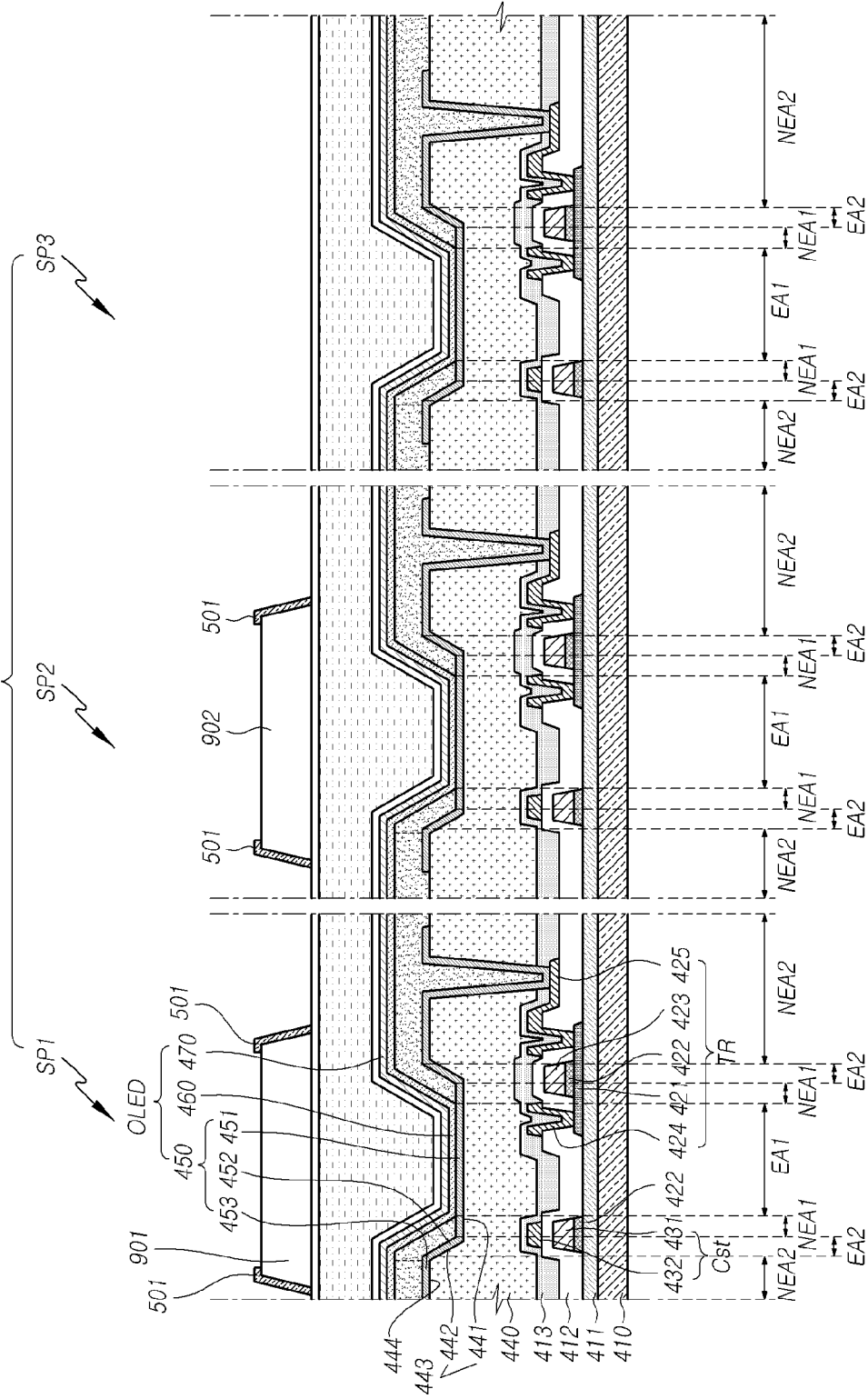
Figure 11:
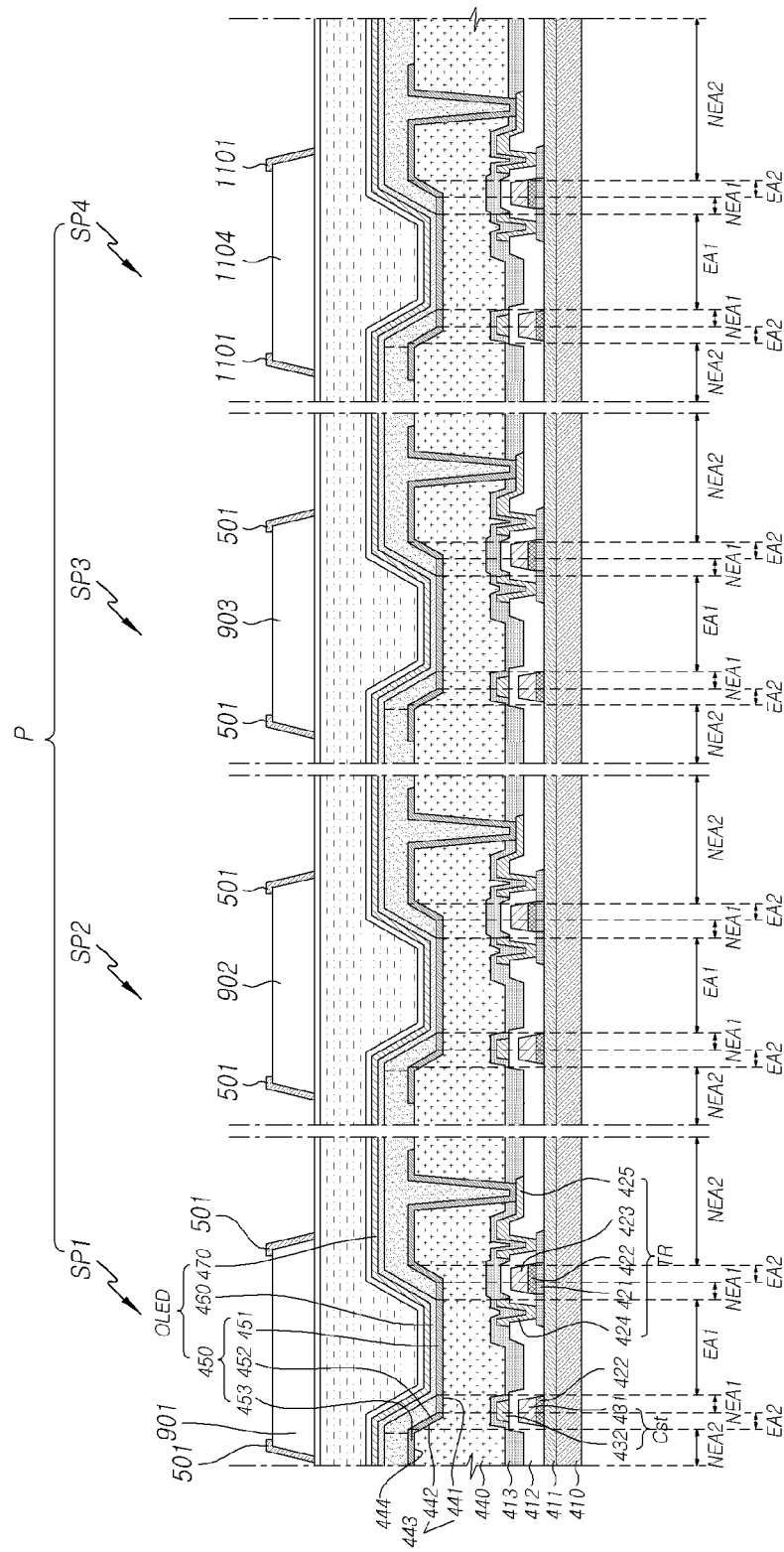

FIGS. 9 to 11 are cross-sectional view illustrating an organic light emitting display device according to yet other embodiments of the disclosure.

Substantially the same configurations and effects as those described above are not repeatedly described below.

Referring to FIG. 9, an organic light emitting display device according to embodiments of the disclosure may include a plurality of subpixels SP1, SP2, and SP3.

For example, the organic light emitting display device according to an embodiment of the disclosure may include a first subpixel SP1, a second subpixel SP2, and a third subpixel SP3.

Although the first to third subpixels SP1, SP2, and SP3 may be one pixel (P) unit, embodiments of the disclosure are not limited thereto. For example, one pixel P may include two or more subpixels.

Although the first to third subpixels SP1, SP2, and SP3 may have light emitting areas that emit different colors of light, embodiments of the disclosure are not limited thereto.

As shown in FIG. 9, one structure may be disposed in one subpixel.

For example, a first structure 901, a second structure 902, and a third structure 903 may be disposed in the first subpixel SP1, the second subpixel SP2, and the third subpixel SP3, respectively.

Where the first subpixel SP1 is a subpixel for emitting red light, the second subpixel SP2 is a subpixel for emitting green light, and the third subpixel SP3 is a subpixel for emitting blue light, the first, second, and third structures 901, 902, and 903 may be a red color filter, a green color filter, and a blue color filter, respectively, but this is merely an example, and embodiments of the disclosure are not limited thereto.

Each of the first to third structures 901, 902, and 903 may be disposed in the first emission area EA1, second emission area EA2, and the first non-emission area NEA1 between the first emission area EA1 and the second emission area EA2, of each subpixel SP1, SP2, and SP3.

A light reflecting member 501 disposed on at least one side surface of the first to third structures 901, 902, and 903 may be disposed in the second non-emission area NEA2 and does not influence the size of the light emitting area EA including the first emission area EA1 and the second emission area EA2.

The first to third structures 901, 902, and 903 may be spaced apart from each other.

The light reflecting member 501 disposed on at least one side surface of each of the first to third structures 901, 902, and 903 may allow the light, which is not extracted to the outside of the organic light emitting display device but is absorbed by other component or travels over to other subpixel, to be extracted to the outside of the organic light emitting display device.

Of the light emitted from the first subpixel SP1, the light travelling over to the second subpixel SP2 or third subpixel SP3 may cause deterioration of the color gamut of the organic light emitting display device.

If a light absorber, e.g., a black matrix, is disposed between the first to third structures 901, 902, and 903 to prevent such issue, the light extraction efficiency of the organic light emitting display device may be reduced.

The organic light emitting display device according to an embodiment of the disclosure may reduce light leakage and allows for extraction, to the outside of the panel, of the light emitted from the subpixel SP, which may otherwise leak out, thereby enhancing light extraction efficiency. Thus, the organic light emitting display device according to the disclosure may achieve an increased brightness.

Although FIG. 9 illustrates a configuration of the organic light emitting display device in which the first to third structures 901, 902, and 903 are disposed to correspond to the first to third subpixels SP1, SP2, and SP3, respectively, disposed in the active area A/A, embodiments of the disclosure are not limited thereto.

As shown in FIG. 10, the structure and the light reflecting member disposed on at least one side surface of the structure may be omitted in at least one subpixel SP3.

For example, where the third subpixel SP3 is a subpixel including a light emitting area for emitting blue light, and the light emitted from the organic layer 460 of the organic light emitting diode (OLED) is blue light, no structure may be disposed on the encapsulation layer 490.

Here, the structure may be an element that serves as a color filter, but embodiments of the disclosure are not limited thereto.

As shown in FIG. 10, structures 901 and 902 which may serve as color filters may be disposed only in some subpixels SP1 and SP2, so that the color coordinates of the organic light emitting display device may be properly adjusted and the process may be simplified.

Although FIGS. 9 and 10 illustrate a configuration in which three subpixels constitute one pixel P, embodiments of the disclosure are not limited thereto.

Referring to FIG. 11, one pixel P may include four subpixels SP1, SP2, SP3, and SP4.

The first subpixel SP1, the second subpixel SP2, the third subpixel SP3, and the fourth subpixel SP4 may be a red subpixel, a green subpixel, a blue subpixel, and a white subpixel, respectively, but embodiments of the disclosure are not limited thereto.

The height of the structure disposed in at least one of the subpixels may differ from the height of the structures disposed in the other subpixels. In other words, at least two of the structures 901, 902, 903, and 1104 disposed in the active area A/A may have different heights.

For example, the height of the fourth structure 1104 disposed in the fourth subpixel SP4 may be smaller than the height of the first to third structures 901, 902, and 903. The adjustment of the thickness of the fourth structure 1104 disposed in the fourth subpixel SP4 may reduce the absorption rate of the light emitted from the light emitting area of the fourth subpixel SP4 while decreasing the external light reflectivity in a polarization plate-free structure.

Thus, the height of the light reflecting member 1101 disposed on at least one side surface of the fourth structure 1104 may also be smaller than the height of the light reflecting member 501 disposed on at least one side surface of each of the first to third structures 901, 902, and 903.

In the organic light emitting display device according to an embodiment of the disclosure, the height of the first to fourth structures 901, 902, 903, and 1104 and the light reflecting members 501 and 1101 may be adjusted as shown in FIG. 11.

The organic light emitting display device according to the disclosure, as shown in FIGS. 4 to 11 may have a multi-panel structure which includes two or more panels connected together.

This is discussed below with reference to FIGS. 12 to 13.

Figure 12:
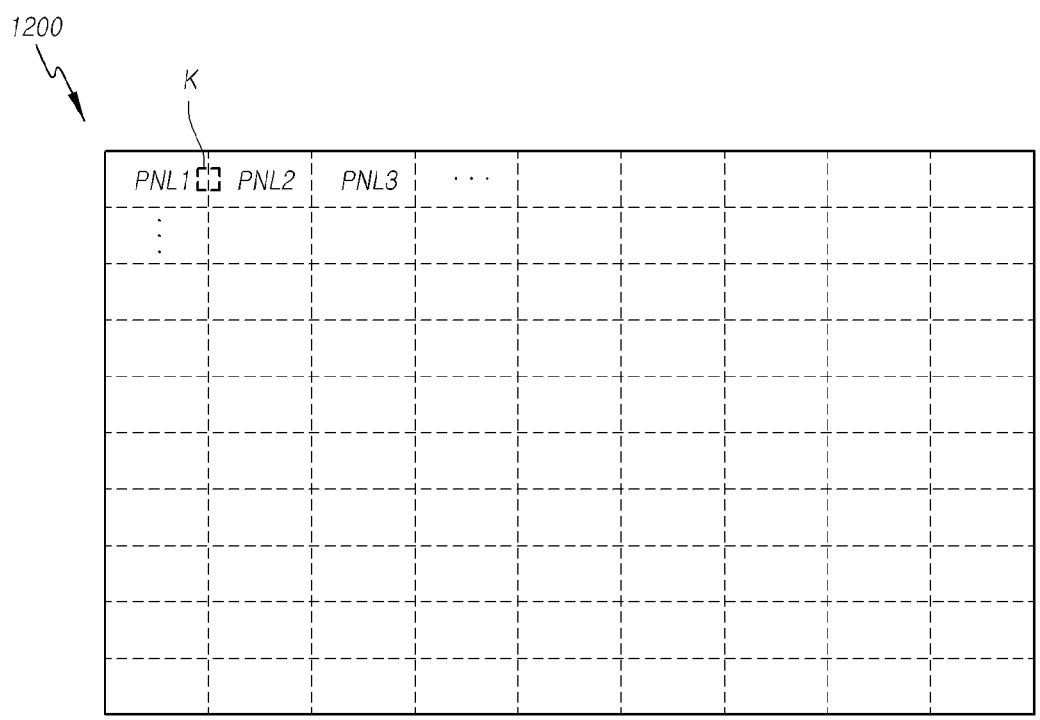
FIG. 12 is a view schematically illustrating an organic light emitting display device according to another embodiment of the disclosure.

FIG. 12 is a view schematically illustrating an organic light emitting display device according to another embodiment of the disclosure. FIG. 13 is a cross-sectional view schematically illustrating area K of FIG. 12.

Substantially the same configurations and effects as those described above are not repeatedly described below.

Referring to FIG. 12, an organic light emitting display device according to another embodiment of the disclosure may have a structure in which two or more panels PNL1, PNL2, PNL3, . . . are connected together.

For example, the plurality of panels PNL1, PNL2, PNL3, . . . of the organic light emitting display device of FIG. 12 may include at least one structure of the panel structures shown in FIGS. 4, 5, 8, 9, and 10.

Figure 13:
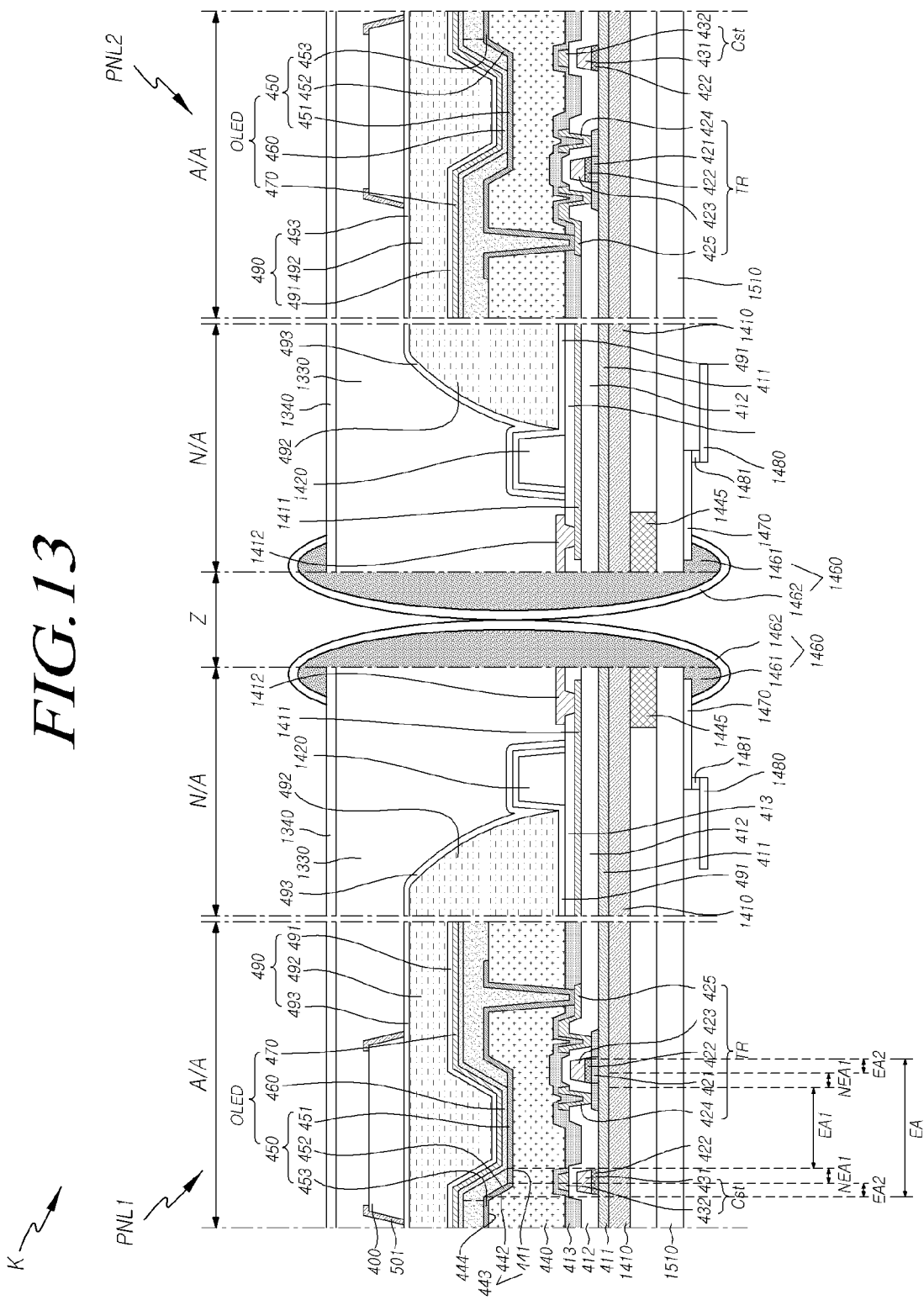
FIG. 13 is a cross-sectional view schematically illustrating area K of FIG. 12.

Referring to FIG. 13, the organic light emitting display device according to an embodiment of the disclosure may include a first panel PNL1 including a first substrate 1410 and a second panel PNL2 including a second substrate 1510.

The active area A/A of the first panel PNL1 may have the same structure as the active area A/A of FIG. 5, but embodiments of the disclosure are not limited thereto.

A buffer layer 411 and an inter-layer insulation film 412 may be disposed on the first substrate 1410 in the non-active area N/A of the first panel PNL1.

A plurality of signal lines 1411 extending up to the active area A/A may be disposed on the inter-layer insulation film 412. A protection film 413 may be disposed on the plurality of signal lines 1411. A plurality of pads 1412 may be disposed on the protection film 413.

The pads 1412 may be electrically connected with the signal lines 1411, and the pads 1412 and the signal lines 1411 may be electrically connected with a plurality of lines (or wires) disposed in the active area A/A to supply signals for driving the subpixels.

The layout structure of the signal lines 1411 and the pads 1412 of FIG. 13 is merely an example, and without limitations to the structure of FIG. 13, the pads 1412 may have a structure corresponding to the structure of FIG. 5.

Meanwhile, the pad 1412 disposed on the first substrate 1410 may be disposed so that one side surface thereof is exposed to the outside as shown in FIG. 13.

At least one dam 1420 may be disposed on the protection film 413 of the non-active area N/A.

A first encapsulation layer 491, a second encapsulation layer 492, and a third encapsulation layer 493 may sequentially be disposed on the first substrate 1410 with the dam 1420 disposed.

The dam 1420 may prevent the second encapsulation layer 492 containing an organic material from flowing over to the outside of the first substrate 1410.

In the active area A/A, a structure 400 and a light reflecting member 501 may be disposed on the encapsulation layer 490.

An adhesive layer 1330 may be disposed on the first substrate 1410 with the structure 400 and the light reflecting member 501 disposed. An upper substrate 1340 may be disposed on the adhesive layer 1330. The adhesive layer 1330 and the upper substrate 1340, along with the encapsulation layer 490, may prevent infiltration of moisture and foreign bodies, but embodiments of the disclosure are not limited thereto.

A lower substrate 1510 connected to a sealant 1445 may be disposed on the rear surface of the first substrate 1410.

A connection electrode 1470 may be disposed on the rear surface of the lower substrate 1510, and the connection electrode 1470 may be electrically connected with a driving circuit 1480 (e.g., a COF) via a conductive adhesive layer 1481.

A connection member 1460 may be disposed on one side surface of the first panel PNL1.

The connection member 1460 may be disposed to surround a portion of the top surface of the upper substrate 1340 of the first panel PNL1, one side surface thereof, one side surface of the lower substrate 1510, and a portion of the rear surface thereof.

The connection member 1460 may include a conductive layer 1461 and a cover layer 1462 surrounding the outside of the conductive layer 1461.

The conductive layer 1461 may play a role to electrically connect the pad 1412 on the first substrate 1410, one side surface of which is exposed to the outside, with the connection electrode 1470 disposed on the rear surface of the lower substrate 1510.

The structure of the second panel PNL2 may be the same as the structure of the first panel PNL1, and the two panels PNL1 and PNL2 positioned adjacent to each other may be disposed, with the connection member 1460 interposed therebetween.

The distance Z between the first substrate 1410 of the first panel PNL1 and the second substrate 1510 of the second panel PNL2 may correspond to the width of one light emitting area EA. The width of the light emitting area EA may mean the largest length of the light emitting area EA along the lengthwise direction of the first and second substrates 1410 and 1510.

As such, as the distance Z between the first substrate 1410 and the second substrate 1510 corresponds to the width of one light emitting area EA, although the plurality of panels are connected together, the inter-panel border may not be recognized by the user.

According to embodiments of the disclosure, a high brightness may be obtained by the structure and the light reflecting member. Thus, for organic light emitting display device with multiple panels connected together, a high brightness may be provided.

According to embodiments of the disclosure, there may be provided an organic light emitting display panel and organic light emitting display device, which has a structure with enhanced light extraction efficiency via a structure disposed to correspond to the light emitting area and a light reflecting member disposed to correspond to the second non-emission area.

According to embodiments of the disclosure, there may be provided an organic light emitting display panel and organic light emitting display device, which has a structure capable of preventing color mixing between two adjacent subpixels.

According to embodiments of the disclosure, there may be provided an organic light emitting display panel and organic light emitting display device, which have a high brightness in a structure in which a plurality of panels are connected.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope consistent with the claims. The scope of protection of the disclosure should be construed based on the following claims, and all technical ideas within the scope of equivalents thereof should be construed as being included within the scope of the disclosure.

LEGEND OF REFERENCE NUMBERS

400: structure
401: light reflecting member
440: insulation film
441: flat portion
442: inclined portion
443: concave portion
444: surrounding portion
450: first electrode
460: organic layer
470: second electrode

What is claimed is:

1. An organic light emitting display panel including a plurality of subpixels, each of the plurality of subpixels including at least one light emitting area, the organic light emitting display panel comprising:
    a substrate;
    an insulation film disposed on the substrate and including a concave portion, the concave portion including a flat portion and an inclined portion surrounding the flat portion in at least one subpixel area;
    a first electrode disposed on the concave portion and a portion of a surrounding portion disposed around the concave portion in the at least one subpixel area;
    a bank including a first portion disposed on the first electrode in an area corresponding to a portion of the concave portion and a second portion disposed on the insulation film and the first electrode in an area corresponding to the surrounding portion;
    an organic layer overlapping the concave portion and disposed on the first electrode, the organic layer including at least one light emitting layer;
    a second electrode disposed on the organic layer and the bank;
    an encapsulation layer disposed on the second electrode;
    a structure disposed on the encapsulation layer, the structure having a tapered shape extending away from an upper surface of the encapsulation layer and overlapping with a center of the flat portion in the at least one subpixel area; and
    a light reflecting member disposed on a first inclined side surface of the structure, a second inclined side surface of the structure opposite to the first inclined side surface, and a portion of a top surface of the structure,
    wherein the light reflecting member includes an opening disposed overlapping a center of the structure and overlapping the center of the flat portion in the at least one subpixel area.

2. The organic light emitting display panel of claim 1, wherein the first electrode includes a light reflective metal.

3. The organic light emitting display panel of claim 1, wherein one of the structure overlaps one light emitting area, and
    wherein the light reflecting member disposed on the first or second inclined side surface of the structure overlaps with the bank.

4. The organic light emitting display panel of claim 1, comprising a plurality of the structures,
    wherein one structure among the plurality of the structures is disposed adjacent to, and apart from, another structure among the plurality of structures.

5. The organic light emitting display panel of claim 1, wherein the opening in the light reflecting member exposes a part of the top surface of the structure.

6. The organic light emitting display panel of claim 1, comprising a plurality of the structures,
    wherein at least two of the structures convert light emitted from the light emitting layer to have different wavelengths.

7. The organic light emitting display panel of claim 1, wherein a color of light emitted from the light emitting layer corresponds to a color of light transmitted through the structure.

8. The organic light emitting display panel of claim 1, comprising a plurality of the structures which are respectively disposed in a plurality of light emitting areas, wherein at least two of the structures have different heights.

9. The organic light emitting display panel of claim 1, wherein the at least one light emitting area of at least one subpixel of the plurality of subpixels includes a first emission area in which the first portion of the bank does not overlap the first electrode in the flat portion of the concave portion.

10. The organic light emitting display panel of claim 9, wherein the at least one light emission area further includes:
a second emission area surrounding the first emission area, and
wherein the second emission area corresponds to an area in which the first electrode overlaps the inclined portion of the concave portion.

11. The organic light emitting display panel of claim 8, wherein the light reflecting members of the at least two of the structures have different heights.

12. The organic light emitting display panel of claim 10, wherein a first non-emission area is disposed between the first emission area and the second emission area.

13. The organic light emitting display panel of claim 12, wherein the first non-emission area is smaller in size than the first emission area and the second emission area.

14. The organic light emitting display panel of claim 12, wherein the first non-emission area corresponds to an area in which the first portion of the bank overlaps the flat portion of the concave portion.

15. The organic light emitting display panel of claim 10, further comprising a second non-emission area surrounding the second emission area.

16. The organic light emitting display panel of claim 1, further comprising an auxiliary electrode contacting the second electrode and disposed in an area corresponding to a non-emission area.

17. An organic light emitting display device including a plurality of subpixels, each of the plurality of subpixels including at least one light emitting area, wherein the organic light emitting display device comprises a plurality of display panels connected to one another, and one of the plurality of display panels comprises:
a first substrate;
an insulation film disposed on the first substrate and including a concave portion, the concave portion including a flat portion and an inclined portion surrounding the flat portion in at least one subpixel area;
a first electrode disposed on the concave portion and a portion of a surrounding portion disposed around the concave portion in the at least one subpixel area;
a bank including a first portion disposed on the first electrode in an area corresponding to a portion of the concave portion and a second portion disposed on the insulation film and the first electrode in an area corresponding to the surrounding portion;
an organic layer overlapping the concave portion and disposed on the first electrode, the organic layer including at least one light emitting layer;
a second electrode disposed on the organic layer and the bank;
an encapsulation layer disposed on the second electrode;
a structure disposed on the encapsulation layer, the structure having a tapered shape extending away from an upper surface of the encapsulation layer and overlapping with a center of the flat portion in the at least one subpixel area; and
a light reflecting member disposed on a first inclined side surface of the structure, a second inclined side surface of the structure opposite to the first inclined side surface, and a portion of a top surface of the structure,
wherein the light reflecting member includes an opening disposed overlapping a center of the structure and overlapping the center of the flat portion in the at least one subpixel area,
wherein, in an area where the flat portion is provided, an area in which the first electrode does not overlap the bank is a first emission area included in the light emitting area,
wherein, in the area where the flat portion is provided, an area in which the bank overlaps the first electrode is a first non-emission area,
wherein, an area corresponding to the inclined portion is a second emission area included in the light emitting area, and
wherein an area corresponding to the surrounding portion is a second non-emission area.

18. The organic light emitting display device of claim 17, wherein another one of the plurality of display panels comprises a second substrate, and
wherein a distance between the first substrate and the second substrate corresponds to a width of one light emitting area of the first substrate.

19. The organic light emitting display device of claim 17, wherein at least one first connection electrode is disposed under the first substrate, and
wherein the first connection electrode and a pad disposed on the first substrate are electrically connected with each other through a connection member disposed on a side surface of the one of plurality of display panels.

20. An organic light emitting display panel including a plurality of subpixels, each subpixel, among the plurality of subpixels, including at least two light emitting areas and at least one non-light emitting area, the organic light emitting display panel comprising:
a substrate;
a transistor on the substrate;
a subpixel of the plurality of subpixels that is electrically connected to the transistor and comprises an organic light emitting diode including a first electrode, a light emitting layer and a second electrode,
an encapsulation layer disposed on the organic light emitting diode;
a structure disposed on the encapsulation later, the structure having a tapered shape extending away from an upper surface of the encapsulation layer and overlapping with a center of the organic light emitting diode; and
a light reflecting member disposed on a first inclined side surface of the structure, a second inclined side surface of the structure opposite to the first inclined side surface, and a portion of a top surface of the structure,
wherein the light reflecting member includes an opening disposed overlapping a center of the structure and overlapping the center of the organic light emitting diode.

* * * * *